United States Patent
Kim et al.

(10) Patent No.: US 11,222,701 B2
(45) Date of Patent: Jan. 11, 2022

(54) FLASH MEMORY DEVICE FOR PROTECTING DATA BY PROGRAMING SELECTION TRANSISTOR OF CELL STRING, AND DATA STORAGE DEVICE COMPRISING SAME

(71) Applicant: SEOUL NATIONAL UNIVERSITY R&DB FOUNDATION, Seoul (KR)

(72) Inventors: Jihong Kim, Seoul (KR); Myung Suk Kim, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 31 days.

(21) Appl. No.: 16/608,635

(22) PCT Filed: Nov. 21, 2018

(86) PCT No.: PCT/KR2018/014324
§ 371 (c)(1),
(2) Date: Oct. 25, 2019

(87) PCT Pub. No.: WO2019/103445
PCT Pub. Date: May 31, 2019

(65) Prior Publication Data
US 2020/0202947 A1 Jun. 25, 2020

(30) Foreign Application Priority Data
Nov. 22, 2017 (KR) .......................... 10-2017-0156821

(51) Int. Cl.
*G11C 16/22* (2006.01)
*G06F 3/06* (2006.01)
(Continued)

(52) U.S. Cl.
CPC ............ *G11C 16/22* (2013.01); *G06F 3/0619* (2013.01); *G06F 3/0659* (2013.01);
(Continued)

(58) Field of Classification Search
CPC .... G06F 3/0619; G06F 3/0659; G06F 3/0679; G11C 16/0483; G11C 16/10; G11C 16/14; G11C 16/22; G11C 16/26
See application file for complete search history.

(56) References Cited

U.S. PATENT DOCUMENTS 6,061,280 A * 5/2000 Aritome .................. G11C 8/20
365/195
8,243,518 B2 8/2012 Oh et al.
(Continued)

FOREIGN PATENT DOCUMENTS

KR 10-1998-0064690 10/1998
KR 10-2013-0050589 5/2013
(Continued)

OTHER PUBLICATIONS

International Search Report PCT/ISA/210 for International Application No. PCT/KR2018/014324 Dated Feb. 22, 2019.

*Primary Examiner* — Eric T Oberly
(74) *Attorney, Agent, or Firm* — Harness, Dickey & Pierce, P.L.C.

(57) ABSTRACT

A flash memory device according to an embodiment of the inventive concept includes a selection transistor for selecting a cell string; and a plurality of memory cells connected in series to the selection transistor, and the selection transistor is programmed such that a threshold voltage of the selection transistor is higher than a non-selection read voltage Vread, for protecting data stored in at least one of the plurality of memory cells. The flash memory according to an embodiment of the inventive concept adjusts the threshold value of the selection transistor or a dummy memory, thus protecting data permanently or temporarily within a short time and recovering original data easily without data loss if necessary.

5 Claims, 28 Drawing Sheets

(51) Int. Cl.
*G11C 16/04* (2006.01)
*G11C 16/10* (2006.01)
*G11C 16/14* (2006.01)
*G11C 16/26* (2006.01)

(52) U.S. Cl.
CPC ........ G06F 3/0679 (2013.01); G11C 16/0483 (2013.01); G11C 16/10 (2013.01); G11C 16/14 (2013.01); G11C 16/26 (2013.01)

(56) References Cited

U.S. PATENT DOCUMENTS

| | | | |
|---|---|---|---|
| 8,891,307 B2 | 11/2014 | Nam | |
| 8,995,192 B2 | 3/2015 | Khouri et al. | |
| 9,343,154 B2 | 5/2016 | Lee | |
| 9,785,493 B1* | 10/2017 | Zhang | G11C 11/5642 |
| 10,074,435 B2 | 9/2018 | Park et al. | |
| 10,152,380 B2 | 12/2018 | Yim et al. | |
| 2009/0003080 A1* | 1/2009 | Noh | G11C 16/3418 365/185.25 |
| 2012/0271986 A1* | 10/2012 | Lo | G06F 12/14 711/103 |
| 2013/0258780 A1* | 10/2013 | Khouri | G11C 16/04 365/185.17 |
| 2015/0063037 A1* | 3/2015 | Lee | G11C 16/10 365/185.24 |
| 2015/0332783 A1* | 11/2015 | Jeong | G11C 16/3454 365/185.11 |
| 2017/0125109 A1* | 5/2017 | Park | G11C 16/32 |
| 2017/0186758 A1 | 6/2017 | Lee et al. | |

FOREIGN PATENT DOCUMENTS

| | | |
|---|---|---|
| KR | 10-2013-0085155 | 7/2013 |
| KR | 10-2013-0111410 | 10/2013 |
| KR | 10-2017-0053087 | 5/2017 |
| KR | 10-2017-0120442 | 10/2017 |
| KR | 10-2009-0120205 | 11/2019 |

* cited by examiner

FLASH MEMORY DEVICE FOR PROTECTING DATA BY PROGRAMMING SELECTION TRANSISTOR OF CELL STRING, AND DATA STORAGE DEVICE COMPRISING SAME

CROSS-REFERENCE TO RELATED APPLICATIONS

This application is a national phase under 35 U.S.C. § 371 of PCT International Application No. PCT/KR2018/014324 which has an International filing date of Nov. 21, 2018, which designated the Republic of Korea and which claims priority to Korean patent application number KR 10-2017-0156821 filed Nov. 22, 2017.

TECHNICAL FIELD

The inventive concept relates to a semiconductor memory device, and more particularly, relates to a flash memory device for protecting data by programming a selection transistor and a data storage device including the same.

BACKGROUND ART

Semiconductor memory devices are generally classified into a volatile memory device such as a DRAM or an SRAM and a nonvolatile memory device such as an EEPROM, an FRAM, a PRAM, an MRAM, or a flash memory. The volatile memory device loses data stored therein when a power is turned off, but the nonvolatile memory device retains data stored therein even though a power is turned off. In particular, the flash memory has advantages such as a high program speed, low power consumption, and storage of a large amount of data. Accordingly, a data storage device including the flash memory is being widely used as a data storage medium.

The flash memory includes memory cells storing data. A word line WL is connected with gates of memory cells, and the memory cells are provided with data through bit lines BL. The flash memory includes a memory block that is implemented with a set of pages, each of which includes memory cells (referred to as a "page") connected to one word line. A page is a read or write unit, and a memory block is an erase unit. In the flash memory, whether to perform a write, read, or erase operation is determined by turning on or off a selection transistor of a memory block targeted for the operation.

The flash memory may secure-erase actual data in the case of intending to destroy data depending on a need of a user. Also, in the case where data are in an abnormal state, the flash memory may perform a secure program operation such that normal recovery is impossible. Meanwhile, in a read operation, the flash memory turns on a string selection transistor of a selected memory block and turns off a string selection transistor of an unselected memory block. As such, whether to perform a read operation on a memory block may be determined depending on an on/off state of a string selection transistor.

A conventional data storage device may perform a write operation such that data stored in a flash memory are erased or normal recovery is impossible. A conventional flash memory may require a relatively long operating time (e.g., several seconds or more) for erasing or programming data stored therein. Also, once memory cells are erased and programmed, data that are stored before erasing are permanently lost and fails to be recovered.

DETAILED DESCRIPTION OF THE INVENTION

Technical Problem

The inventive concept provides a flash memory device that protects and recovers data easily without a change of hardware and a data storage device including the same.

Technical Solution

A flash memory device according to an embodiment of the inventive concept may include a selection transistor for selecting a cell string; and a plurality of memory cells connected in series to the selection transistor. The selection transistor may be programmed such that a threshold voltage of the selection transistor is higher than a non-selection read voltage (Vread), for protecting data stored in at least one of the plurality of memory cells.

As an embodiment, the selection transistor may be a string selection transistor connected between a bit line and the plurality of memory cells. Alternatively, the selection transistor may be a ground selection transistor connected between a common source line and the plurality of memory cells.

As an embodiment, when the selection transistor is programmed, a voltage of 0 V may be applied to a plurality of word lines respectively connected to the plurality of memory cells, and a voltage for setting the threshold voltage of the selection transistor to be higher than the non-selection read voltage (Vread) may be applied to a selection line connected to the selection transistor.

As an embodiment, for recovering data stored in the at least one of the plurality of memory cells, after the selection transistor is erased, the selection transistor may be reprogrammed such that the threshold voltage of the selection transistor is set to an initial state. When the selection transistor is erased, gates of the plurality of memory cells may be in a floating state, 0 V may be applied to a selection line connected to the selection transistor, and an erase voltage may be applied to a substrate.

As an embodiment, the reprogramming of the selection transistor may be performed in an ISPP manner. When the selection transistor is reprogrammed, a voltage of 0 V may be applied to a plurality of word lines respectively connected to the plurality of memory cells, and a normal program voltage may be provided to a selection line connected to the selection transistor.

As an embodiment, the flash memory device may include a dummy memory cell between the selection transistor and the plurality of memory cells, and the dummy memory cell may be programmed such that a threshold voltage of the dummy memory cell is higher than the non-selection read voltage (Vread), for protecting data stored in the at least one of the plurality of memory cells. An erase and reprogram operation may be inhibited with regard to the dummy memory cell. The selection transistor and the plurality of memory cells are stacked in a direction perpendicular to a substrate.

Another aspect of the inventive concept may include a flash memory including a memory block for storing data; and a memory controller provides a data protection command to the flash memory for protecting data stored in the memory block. The flash memory may program a selection transistor for selecting a cell string of the memory block such that a threshold voltage of the selection transistor is higher than a non-selection read voltage (Vread).

As an embodiment, the flash memory may include a plurality of memory cells connected in series with the selection transistor, and the selection transistor and the plurality of memory cells may be stacked in a direction perpendicular to a substrate and have a same cell structure. When the flash memory programs the selection transistor, the flash memory applies a voltage of 0 V to a plurality of word lines respectively connected to the plurality of memory cells, and applies a voltage for setting the threshold voltage of the selection transistor to be higher than the non-selection read voltage (Vread) to a selection line connected to the selection transistor.

The memory controller may provide a data recovery command to the flash memory for recovering data stored in at least one of the plurality of memory cells.

For recovering data stored in the at least one of the plurality of memory cells, the flash memory may erase the selection transistor and may then reprogram the selection transistor such that the threshold voltage of the selection transistor is set to an initial state.

When the flash memory erases the selection transistor, the flash memory may set gates of the plurality of memory cells to a floating state, may apply 0 V to a selection line connected to the selection transistor, and may apply an erase voltage to a substrate. When the flash memory reprograms the selection transistor, the flash memory may apply a voltage of 0 V to a plurality of word lines respectively connected to the plurality of memory cells, and may provide a normal program voltage to a selection line connected to the selection transistor.

As an embodiment, the flash memory may include a dummy memory cell between the selection transistor and the plurality of memory cells, and the flash memory may program the dummy memory cell such that a threshold voltage of the dummy memory cell is higher than the non-selection read voltage (Vread), for protecting data stored in at least one of the plurality of memory cells. The flash memory may inhibit an erase and reprogram operation with regard to the dummy memory cell.

A data storage device according to an embodiment of the inventive concept includes a flash memory including a plurality of memory cells connected in series to a bit line, and a memory controller. When an address for reading first data stored in a first memory cell of the plurality of memory cells is received from a host, the memory controller is configured to provide a data protection command to the flash memory in a protection mode for protecting data stored in the plurality of memory cells and to provide a read command to the flash memory in a read mode for reading data stored in the plurality of memory cells, and the flash memory is configured to apply voltages to a plurality of word lines, which are connected to the plurality of memory cells, and the bit line in response to the data protection command such that a first current corresponding to the first data does not flow through the bit line.

As an embodiment, in response to the read command, the flash memory may apply a selection read voltage to a selected word line corresponding to the received address from among the plurality of word lines, may apply a first non-selection read voltage to each of unselected word lines, and may apply a first pre-charge voltage to the bit line.

As an embodiment, in response to the data protection command, the flash memory may apply the selection read voltage to the selected word line, may apply the first non-selection read voltage to each of the unselected word lines, and may apply a second pre-charge voltage smaller than the first pre-charge voltage to the bit line. As the second pre-charge voltage is applied, the first current may not flow through the bit line.

As an embodiment, the memory controller may be configured to return a data read failure message to the host.

As an embodiment, in response to the data protection command, the flash memory may apply the selection read voltage to the selected word line, may apply a second non-selection read voltage smaller than the first non-selection read voltage to each of the unselected word lines, and may apply the first pre-charge voltage to the bit line. As the second non-selection read voltage is applied, the first current may not flow through the bit line.

As an embodiment, the memory controller may be configured to return a data read failure message to the host.

As an embodiment, the memory controller may provide the data protection command to the flash memory when the received address is matched with a preset address and may provide the read command to the flash memory when the received address is not matched with the preset address.

Advantageous Effects of the Invention

A flash memory according to an embodiment of the inventive concept may adjust a threshold value of a selection transistor or a dummy memory, thus protecting data permanently or temporarily within a short time and recovering original data easily without data loss if necessary.

MODE FOR CARRYING OUT THE INVENTIVE CONCEPT

Below, embodiments of the inventive concept may be described in detail and clearly to such an extent that an ordinary one in the art easily implements the inventive concept.

I. Data Storage Device Including Flash Memory

Figure 1:
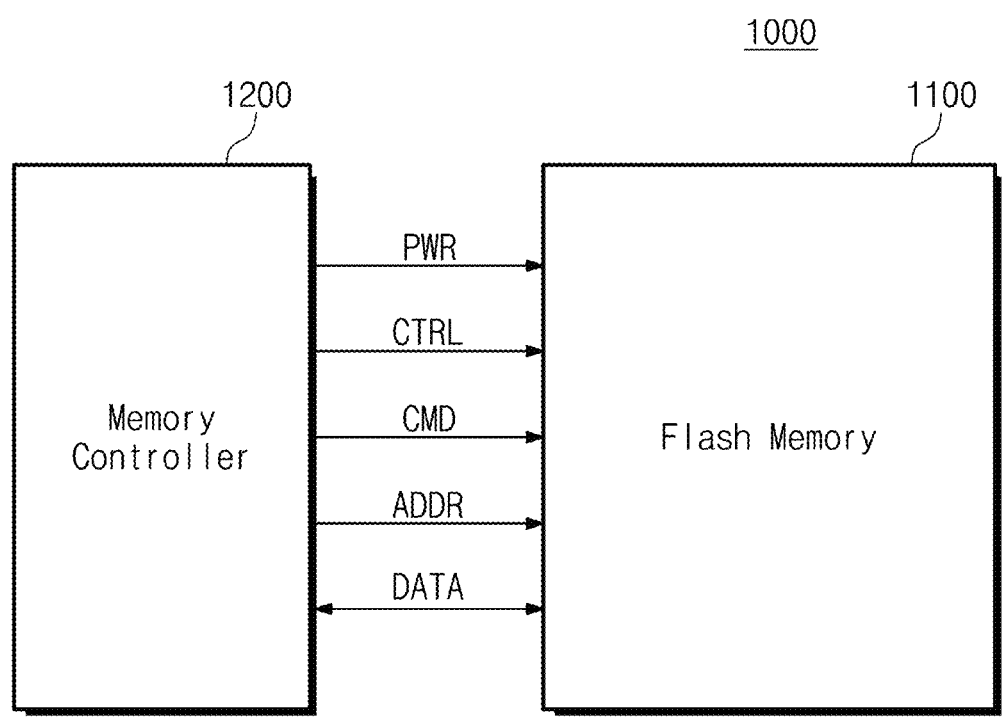
FIG. 1 is a block diagram illustrating a data storage device including a flash memory.

FIG. 1 is a block diagram illustrating a data storage device including a flash memory. Referring to FIG. 1, a data storage device 1000 may include a flash memory 1100 and a memory controller 1200. The data storage device 1000 may include any data storage medium, which is based on the flash memory 1100, such as a memory card, an USB memory, an eMMC, an UFS, an SSD, or the like.

The flash memory 1100 may perform an erase, write, or read operation under control of the memory controller 1200. To this end, the flash memory 1100 may be provided with a power PWR through a power line and may be provided with a command CMD, an address ADDR, and data "DATA" through an input/output line I/O. The flash memory 1100 may receive a program command and an address from the memory controller 1200 and may store the data "DATA" in a selected page. The flash memory 1100 may receive a read command and may provide data read from a selected page to the memory controller 1200.

The memory controller 1200 uses a specified protocol manner or a NAND flash interface manner when storing data in the flash memory 1100 or reading data from the flash memory 1100. The memory controller 1200 provides data to the input/output line I/O, and the flash memory 1100 identifies the command CMD, the address ADDR, or the data "DATA", based on a control signal CTRL input through a control line. The control signal CTRL may include a command latch enable (CLE) signal, an address latch enable (ALE) signal, a chip enable (nCE) signal, a write enable (nWE) signal, a read enable (nRE) signal, and the like.

Figure 2:
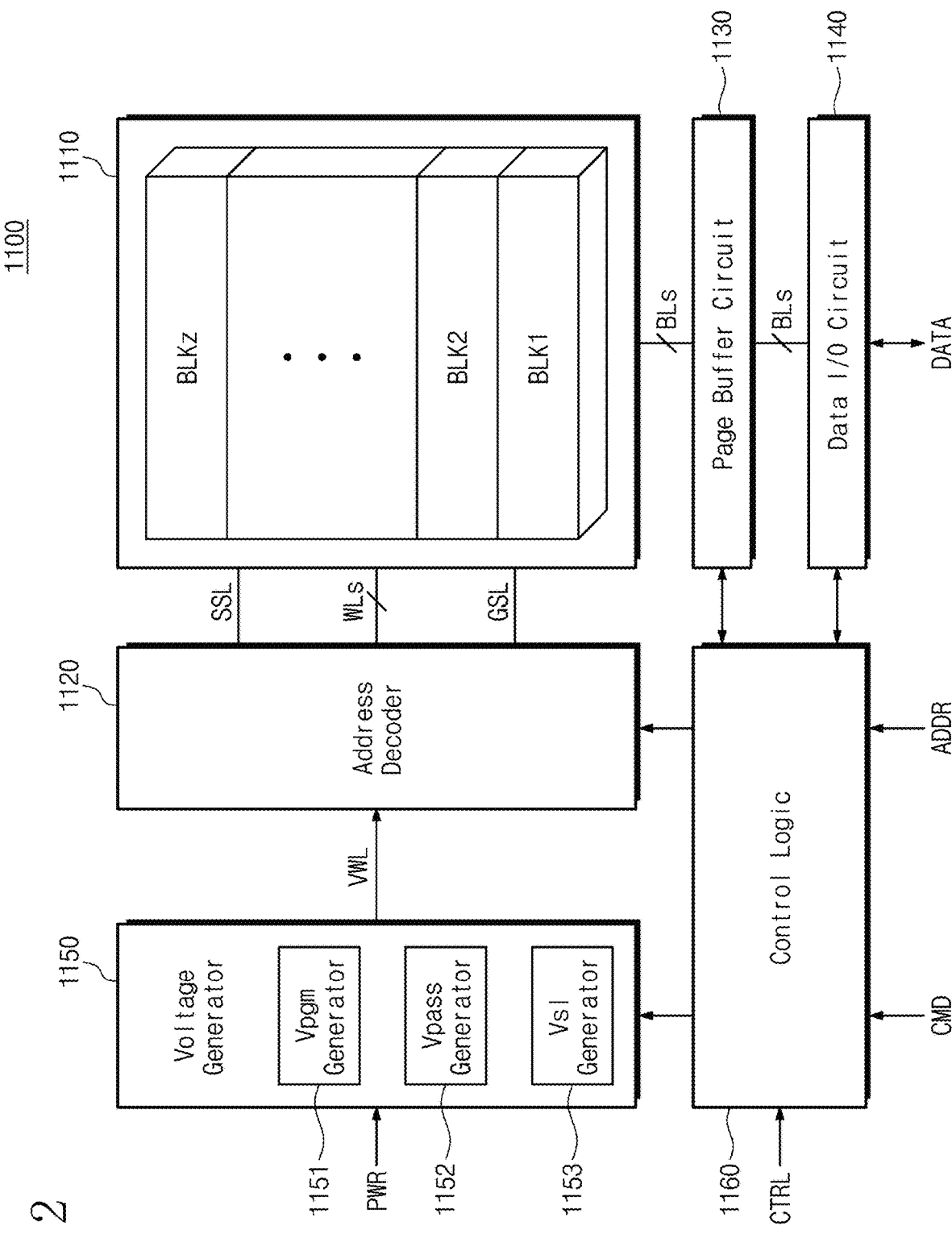
FIG. 2 is a block diagram illustrating a flash memory illustrated in FIG.

FIG. 2 is a block diagram illustrating a flash memory illustrated in FIG. 1. Referring to FIG. 2, the flash memory 1100 may include a memory cell array 1110, an address decoder 1120, a page buffer circuit 1130, a data input/output (I/O) circuit 1140, a voltage generator 1150, and control logic 1160.

The memory cell array 1110 may include a plurality of memory blocks BLK1 to BLKz. Each memory block may have a three-dimensional structure (or a vertical structure). Memory cells of a memory block having a two-dimensional structure (or a horizontal structure) are formed in a direction parallel to a substrate. However, memory cells of a memory block having the three-dimensional structure are formed in a direction perpendicular to the substrate.

Each memory block includes a plurality of pages. A plurality of memory cells may be connected to one word line. A set of memory cells that are connected to one word line and are programmed at the same time is referred to as a "page". The flash memory 1100 may perform an erase operation in the unit of memory block and a write or read operation in the unit of page.

Each memory cell may store one data bit or two or more data bits. A memory cell that is able to store one bit is referred to as a "single-level cell" (SLC) or "single bit cell". A memory cell that is able to store two or more bits is referred to as a "multi-level cell" (MLC) or "multi-bit cell".

The address decoder 1120 is connected to the memory cell array 1110 through selection lines SSL and GSL or word lines WLs. The address decoder 1120 is provided with a word line voltage VWL from the voltage generator 1150 and is controlled by the control logic 1160. The address decoder 1120 selects a word line in a program or read operation. A program or read voltage is provided to the selected word line.

The page buffer circuit 1130 is connected with the memory cell array 1110 through bit lines BLs. The page buffer circuit 1130 may include a plurality of page buffers (not illustrated). One page buffer may be connected with one bit line or may be connected with two or more bit lines. The page buffer circuit 1130 may temporarily store data to be programed in a selected page or data read from the selected page.

The data input/output circuit 1140 is connected with the page buffer circuit 1130 through data lines DLs internally and is connected with the memory controller 1200 (refer to FIG. 1) through the input/output line externally. The data input/output circuit 1140 is provided with program data from the memory controller 1200 in the program operation and provides read data to the memory controller 1200 in the read operation.

The voltage generator 1150 may be provided with the power PWR from the memory controller 1200 and may generate the word line voltage VWL necessary to read or write data. The word line voltage VWL is provided to the address decoder 1120. The voltage generator 1150 may generate a high voltage (HV) higher than a power supply voltage Vcc. The high voltage may be used as a program voltage Vpgm or a pass voltage Vpass.

Continuing to refer to FIG. 2, the voltage generator 1150 may include a Vpgm generator 1151, a Vpass generator 1152, and a Vsl generator 1153. The Vpgm generator 1151 generates the program voltage Vpgm to be provided to a selected word line in the program operation. The program voltage Vpgm may increase as a program loop progresses. The Vpass generator 1152 generates the pass voltage Vpass to be provided to selected and unselected word lines in the program operation. In general, the pass voltage Vpass is maintained uniformly even though a program loop is repeated. The Vsl generator 1153 generates a selection line voltage to be provided to a string selection line SSL or a ground selection line GSL.

The control logic 1160 may control the program, read and erase operations of the flash memory 1100 by using the command CMD, the address ADDR, and the control signal CTRL. For example, in the program operation, the control logic 1160 may control the address decoder 1120 such that the program voltage Vpgm is provided to a selected word line and may control the page buffer circuit 1130 and the data input/output circuit 1140 such that program data are provided to a selected page.

Figure 3:
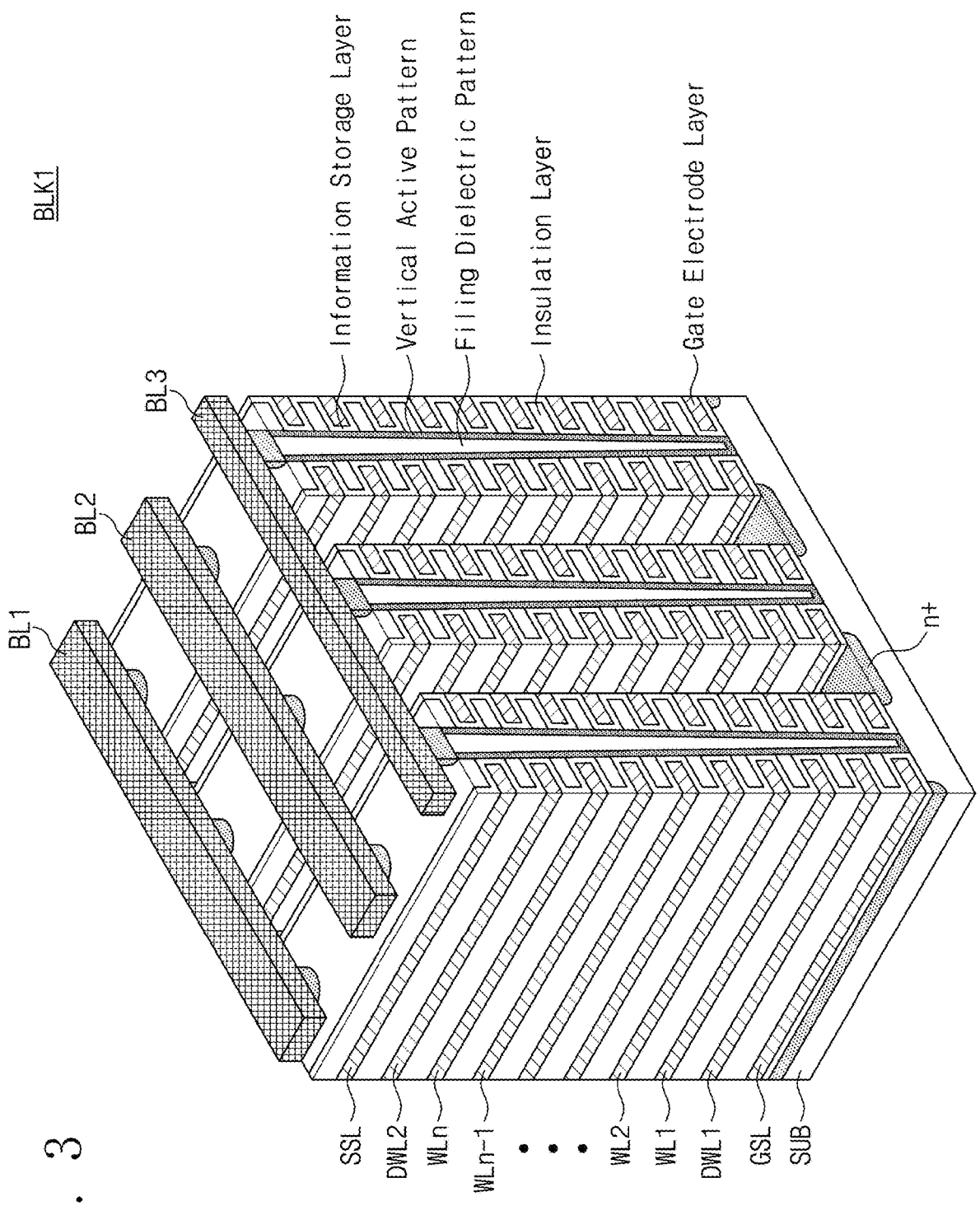
FIG. 3 is a perspective view illustrating a three-dimensional structure of a memory block BLK1 illustrated in FIG. 2.

FIG. 3 is a perspective view illustrating a three-dimensional structure of the memory block BLK1 illustrated in FIG. 2. Referring to FIG. 3, the memory block BLK1 may be formed in a direction perpendicular to a substrate SUB. An n+ doping region is formed in the substrate SUB. A gate electrode layer and an insulation layer may be alternately deposited on the substrate SUB.

An information storage layer may be formed between the gate electrode layer and the insulation layer. The information storage layer may include a tunnel insulation layer, a charge storage layer, and a blocking insulation layer.

When the gate electrode layers and the insulating layers are patterned in a vertical direction (vertical patterning), V-shaped pillars are formed. The pillars are connected with the substrate SUB through the gate electrode layers and the insulating layers. Inner portions of the pillars may be a filing dielectric pattern and may be formed of an insulating material such as silicon oxide. Outer portions of the pillars may be a vertical active pattern and may be formed of channel semiconductor.

The gate electrode layers of the memory block BLK1 may be connected to the ground selection line GSL, a plurality of dummy word lines DWL1 and DWL2, a plurality of word lines WL1 to WLn, and the string selection line SSL. In addition, the pillars of the memory block BLK1 may be connected to a plurality of bit lines BL1 to BL3.

Referring to FIG. 3, the memory block BLK1 may include a dummy word line DWL. The dummy word line DWL is for protecting the word line WL and making a pattern of a memory cell uniform. The first dummy word line DWL1 is interposed between the ground selection line GSL and the first word line WL1, and the second dummy word line DWL2 is interposed between the string selection line SSL and the n-th word line WLn.

Figure 4:
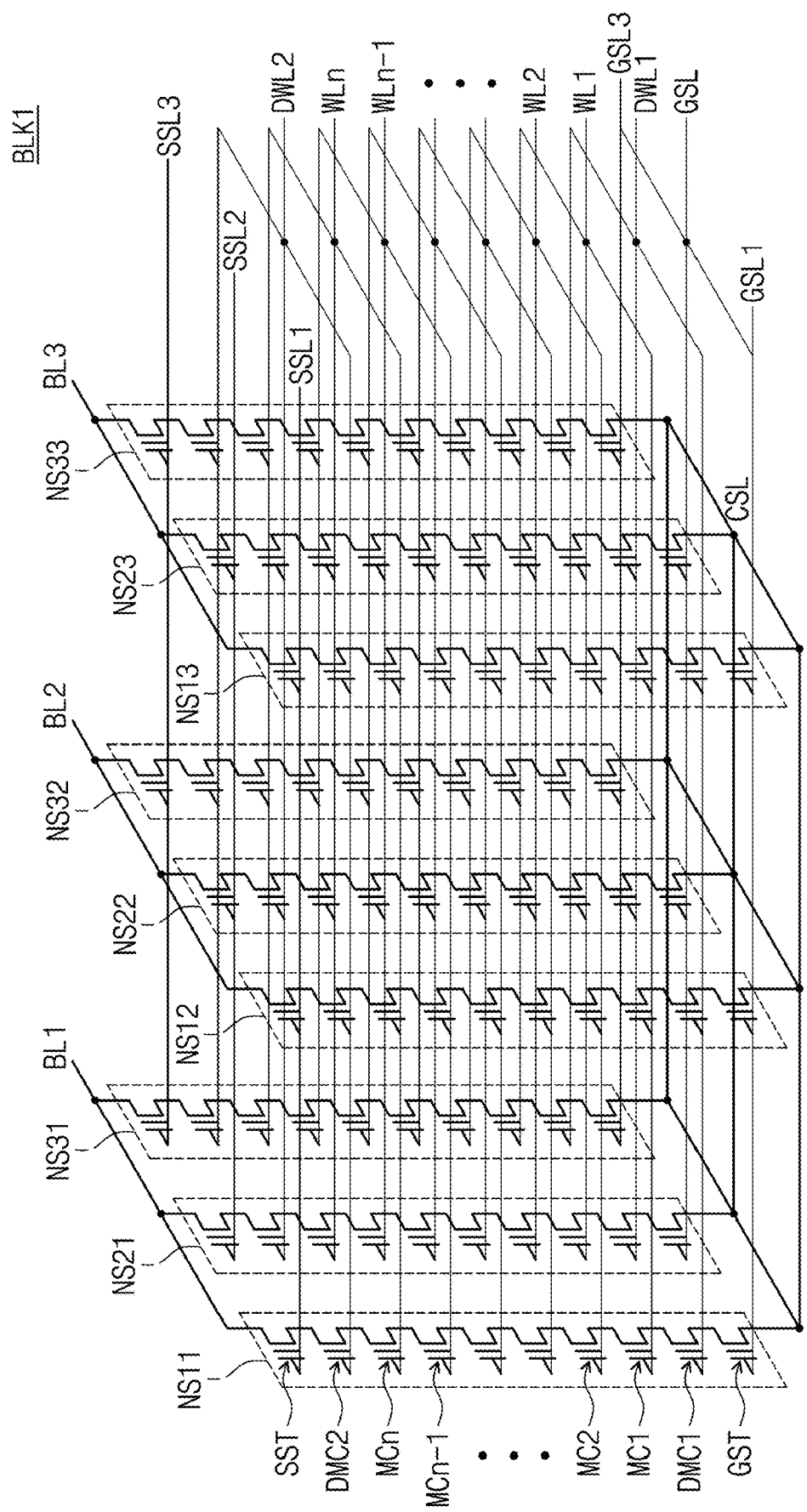
FIG. 4 is an equivalent circuit of the memory block BLK1 illustrated in FIG. 3.

FIG. 4 is an equivalent circuit of the memory block BLK1 illustrated in FIG. 3. Referring to FIG. 4, NAND strings NS11 to NS33 are connected between a common source line CSL and the bit lines BL1 to BL3. Each NAND string (e.g., NS11) includes a ground selection transistor GST, a plurality of memory cells MC1 to MCn, a plurality of dummy memory cells DMC1 and DMC2, a string selection transistor SST. Here, a NAND string may be referred to as "cell string".

The string selection transistor SST is connected to the string selection line SSL. The string selection line SSL may be divided into first to third string selection lines SSL1 to SSL3. The plurality of memory cells MC1 to MCn are connected to the corresponding word lines WL1 to WLn, respectively. The plurality of dummy memory cells DMC1 and DMC2 are connected to the corresponding dummy word lines DWL1 and DWL2. Word lines (e.g., WL2) of the same height are connected in common. The ground selection transistor GST is connected to the ground selection line GSL. The ground selection lines GSL of respective cell strings are connected. The string selection transistor SST is connected to the bit line BL, and the ground selection transistor GST is connected to the common source line CSL.

Continuing to refer to FIG. 4, the memory cells MC of the memory block BLK1 may include a dummy memory cell DMC. The dummy memory cell DMC is connected to a dummy word line DWL (refer to FIG. 3). The first dummy memory cell DMC1 is connected to the first dummy word line DWL1 and is connected between the ground selection transistor GST and the first memory cell MC1. The second dummy memory cell DMC2 is connected to the second dummy word line DWL2 and is connected between the string selection transistor SST and the n-th memory cell MCn.

Figure 5:
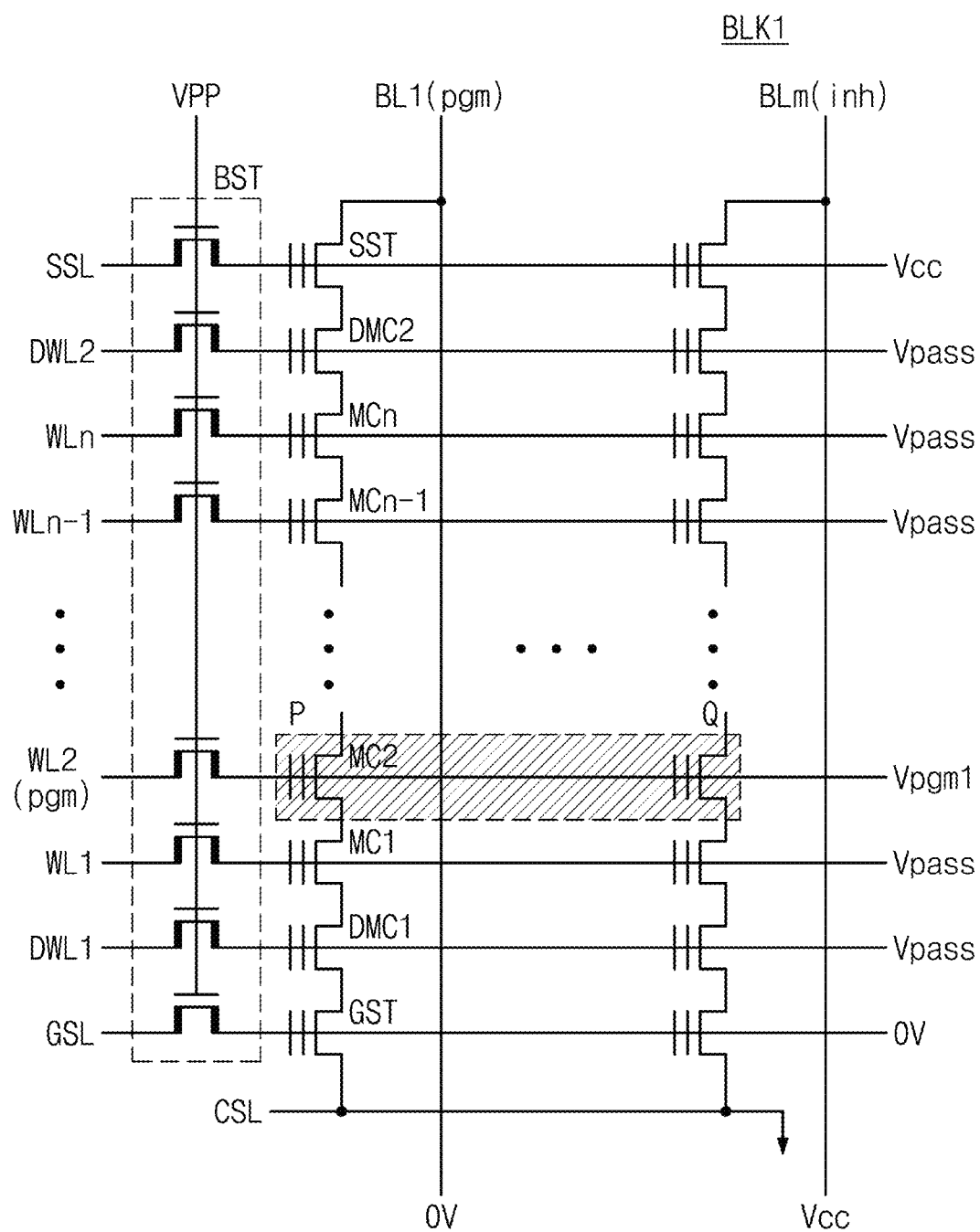
FIG. 5 is a circuit diagram illustrating a memory block of a flash memory illustrated in FIG. 3.

FIG. 5 is a circuit diagram illustrating a memory block of a flash memory illustrated in FIG. 3. The memory block BLK1 of the flash memory 1100 is selected by a plurality of block selection transistors BST. The block selection transistors BST may be implemented with a high voltage transistor that is able to withstand a high voltage applied to a gate or drain thereof. In the case of selecting the memory block BLK1, a high voltage VPP is applied to gates of the block selection transistors BST.

The memory block BLK1 includes "m" cell strings respectively connected to first to m-th bit lines BL1 to BLm. A cell string connected to the first bit line BL1 includes the string selection transistor SST connected to the string selection line SSL, the plurality of memory cells MC1 to MCn connected to the plurality of word lines WL1 to WLn, the plurality of dummy memory cells DMC1 and DMC2 connected to the plurality of dummy word lines DWL1 and DWL2, and the ground selection transistor GST connected to the ground selection line GSL. The string selection transistor SST is connected to the bit line BL1, and the ground selection transistor GST is connected to the common source line CSL.

Figure 6:
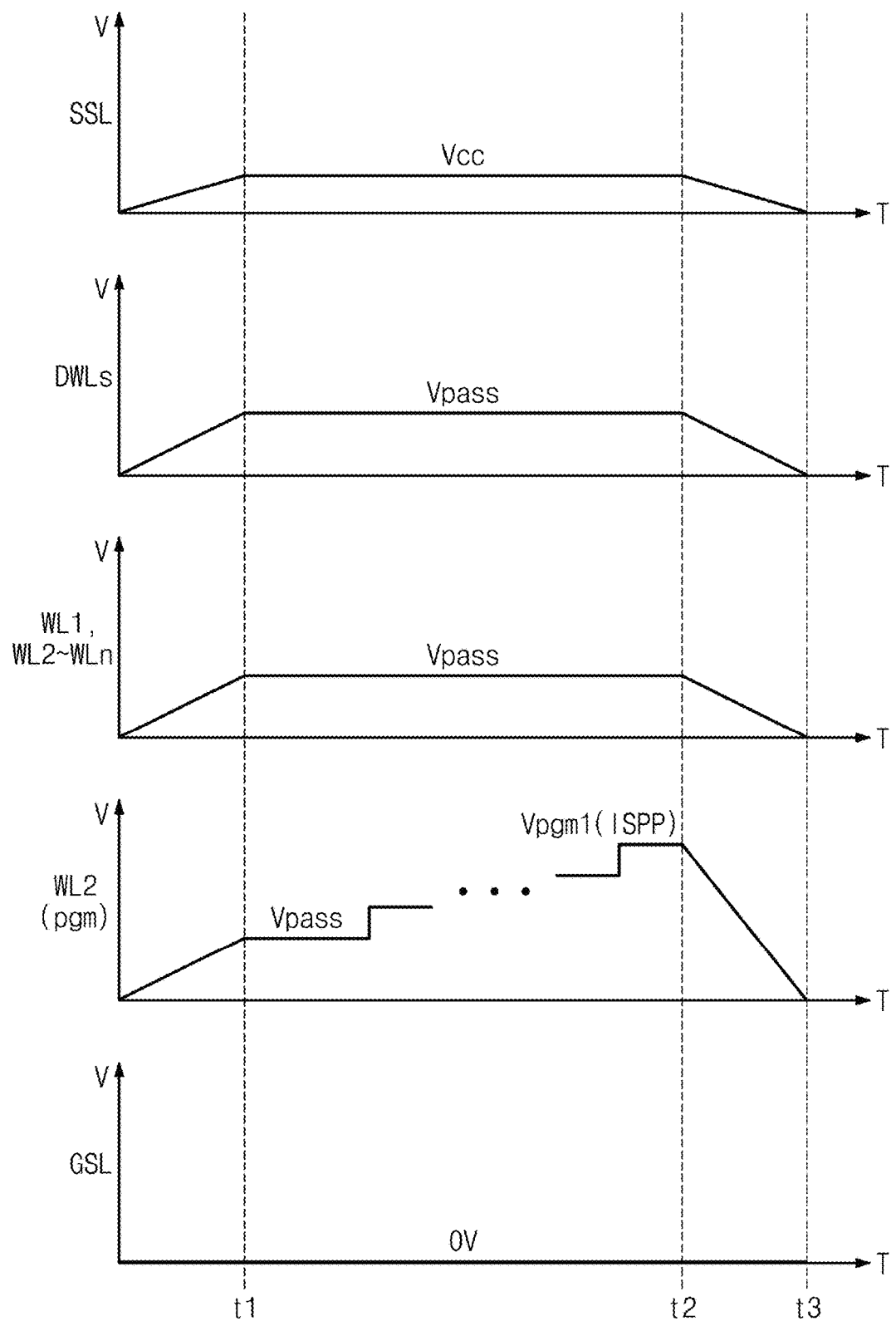
FIG. 6 is a timing diagram illustrating a program bias condition of a flash memory illustrated in FIG. 5.

FIG. 6 is a timing diagram illustrating a program bias condition of a flash memory illustrated in FIG. 5. Referring to FIGS. 5 and 6, in the program operation, 0 V is applied to the bit line BL1 connected to a memory cell (hereinafter referred to as a "program cell") targeted for the program operation, and the power supply voltage Vcc is applied to the bit line BLm connected to a memory cell (hereinafter referred to as a "program inhibit cell") not targeted for the program operation. Below, a bit line to which a program cell "P" is connected is defined as a program bit line, and a bit line to which a program inhibit cell "0" is connected is defined as a program inhibit bit line. In FIG. 5, the first bit line BL1 is a program bit line BL1 (pgm), and the m-th bit line BLm is a program inhibit bit line BLm (inh).

In the program operation, the power supply voltage Vcc is applied to the string selection line SSL, and 0 V is applied to the ground selection line GSL. The program voltage Vpgm (e.g., 18 V) is applied to a selected word line (e.g., WL2), and the pass voltage Vpass (e.g., 8 V) is applied to unselected word lines. A flash memory increases the program voltage Vpgm as a program loop progresses. To program a memory cell that is not completely programmed, the flash memory increases the program voltage as the program loop progresses. This is called "incremental step pulse program (ISPP)".

According to the program bias condition, because Vpgm is applied to a gate of the program cell "P" and a channel voltage is 0 V, a strong electric field is formed between the gate of the program cell "P" and a channel. In this case, electrons that are present in the channel of the program cell "P" are injected into a floating gate thereof by the F-N tunneling.

Meanwhile, when the program voltage Vpgm is applied to a gate of the program inhibit cell "0", because a channel of the program inhibit cell "0" is in a floating state, a channel voltage increases to a boosting level (e.g., about 8 V) by the capacitive boosting effect between the gate and the channel.

Because an electric field enough to generate the F-N tunneling is not formed between the gate and the channel of the program inhibit cell "0", the program inhibit cell "0" is not programmed.

Figure 7:
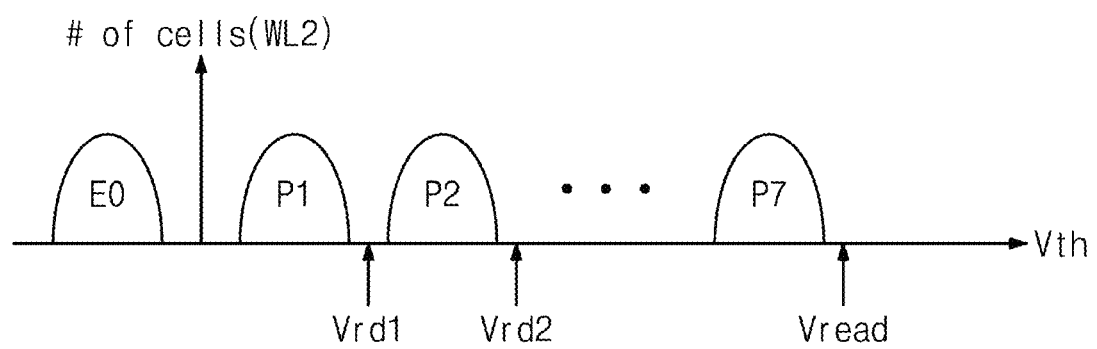
FIG. 7 is a diagram illustrating a threshold voltage distribution of memory cells connected to a selected word line WL2 where a program operation is performed.

FIG. 7 is a diagram illustrating a threshold voltage distribution of memory cells connected to the selected word line WL2 where a program operation is performed. Referring to FIG. 7, a horizontal axis represents a threshold voltage Vth, and a vertical axis represents the number of memory cells.

The flash memory 1100 (refer to FIG. 2) programs memory cells connected to one word line WL2 at the same time. This program operation is called a "page program operation". A 3-bit memory cell may have one of eight states E0 and P1 to P7 depending on a threshold voltage distribution. Here, E0 indicates an erase state of a memory cell, and P1 to P7 indicate program states.

The flash memory 1100 performs a page read operation. In the read operation, a selection read voltage Vrd1, Vrd2, etc. is provided to the selected word line WL2, and a non-selection read voltage Vread is provided to unselected word lines WL1 and WL3 to WLn. Here, the non-selection read voltage Vread is a voltage enough to turn on memory cells connected to a word line.

In the case of a two-dimensional flash memory, the string selection transistor SST to select a cell string is similar or equal in structure to an NMOS transistor. A threshold voltage Vth of a string selection transistor is determined in a process procedure. In contrast, in the case of a three-dimensional flash memory, the string selection transistor SST is equal in structure to a memory cell to store data. The threshold voltage Vth of the string selection transistor SST may be adjusted through a program or erase operation of a flash memory.

II. Flash Memory-Based User Device Supporting Data Protection and Recovery Operations The inventive concept relates to a method for protecting and recovering data easily without a change of hardware in a data storage device that is based on a three-dimensional flash memory. A data storage device that is based on a conventional flash memory may be problematic in that there is taken a long time to protect and recover data or it is impossible to recover data due to the loss of original data.

The three-dimensional flash memory according to an embodiment of the inventive concept may adjust a threshold value of a selection transistor or a dummy memory, thus protecting data permanently or temporarily within a short time and recovering original data easily without data loss if necessary. The inventive concept may program a threshold voltage of the selection transistor SST or a dummy memory cell to a voltage higher than the non-selection read voltage Vread in a data protection operation and may perform an erase operation to reprogram the threshold voltage Vth to an initial voltage in a data recovery operation.

Figure 8:
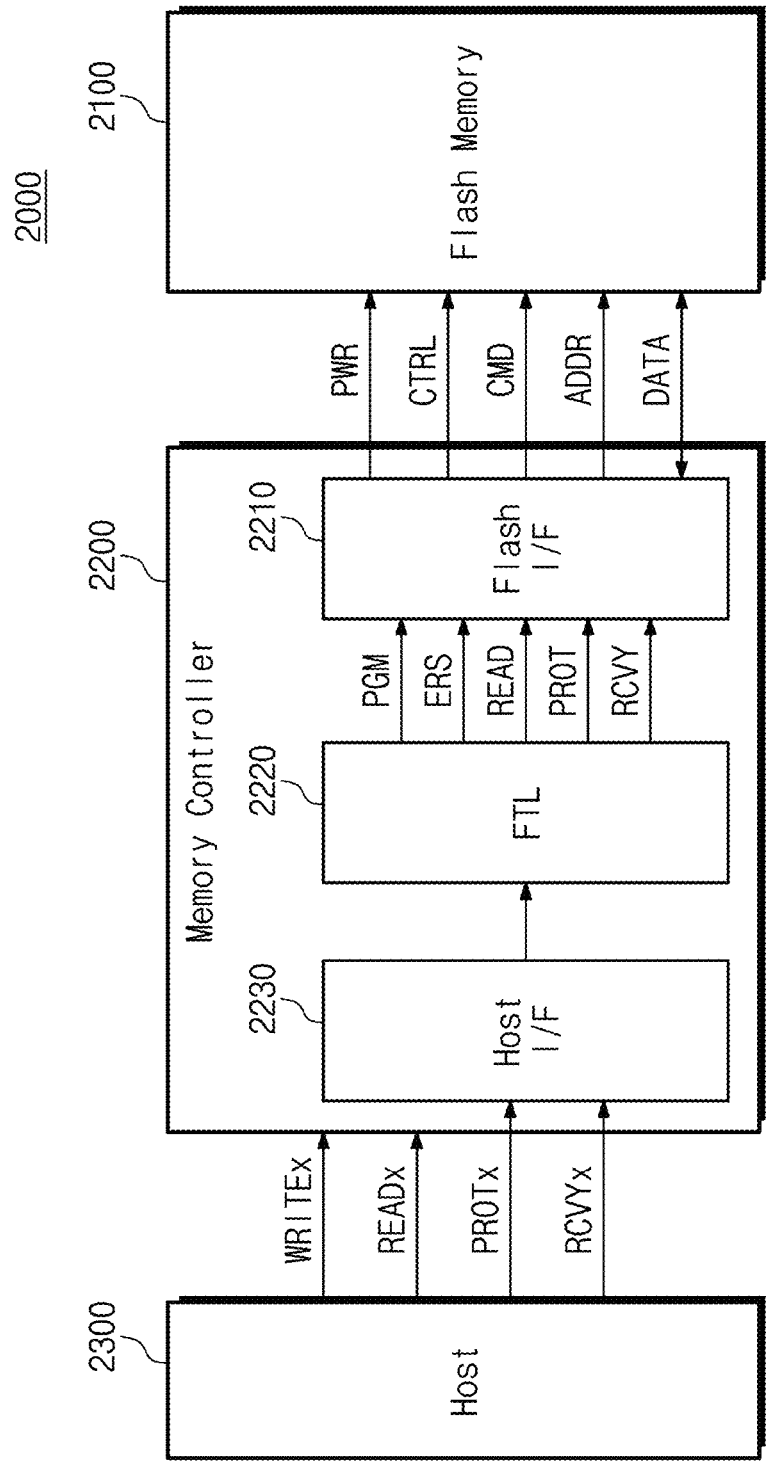
FIG. 8 is a block diagram illustrating a user device according to an embodiment of the inventive concept.

FIG. 8 is a block diagram illustrating a user device according to an embodiment of the inventive concept. Referring to FIG. 8, a user device 2000 includes a flash memory 2100, a memory controller 2200, and a host 2300. The user device 2000 illustrated in FIG. 8 may include a data storage device, which includes the flash memory 2100 and the memory controller 2200, such as a memory card, a USB memory, an eMMC, an UFS, an SSD, or the like. The data storage device may be embedded in the host 2300 such as a computer or a smartphone or may be used as an external storage medium.

The flash memory 2100 may perform an erase, write or read operation under control of the memory controller 1200. The flash memory 2100 may be provided with the command CMD, the address ADDR, and the data "DATA" through the input/output line I/O. Also, the flash memory 2100 may be supplied with the power PWR through a power line and may be provided with the control signal CTRL through a control line.

The memory controller 2200 may include a flash interface 2210 for exchanging data with the flash memory 2100 and a host interface 2230 for exchanging data with the host 2300. The flash interface 2210 may provide a power PWR to the flash memory 2100 or may provide the command CMD, the address ADDR, the data "DATA", and the control signal CTRL for an operation of the flash memory 2100. The control signal CTRL may include a command latch enable (CLE) signal, an address latch enable (ALE) signal, a chip enable (nCE) signal, a write enable (nWE) signal, a read enable (nRE) signal, etc.

Unlike a hard disk drive, because not supporting an overwrite operation, the flash memory 2100 may erase a memory block in which data are stored and may then perform a program operation (erase-before-program). Due to this physical characteristic of the flash memory 2100, the memory controller 2200 includes software called a "flash translation layer (FTL)" 2220. The flash translation layer 2220 may operate on a memory (not illustrated) provided in the memory controller 2200.

The host interface 2230 may receive a write request WRITEx or a read request READx from the host 2300. The host interface 2230 may receive a logical address together with the write request or the read request from the host 2300. The flash translation layer (FTL) 2220 may translate a logical address provided from the host 2300 into a physical address available in the flash memory 2100.

The flash translation layer 2220 may manage an address translation and management operation through a mapping table. A logical address and a physical address corresponding thereto are correlated with each other in the mapping table. The size of the mapping table may vary depending on a mapping unit, and the mapping table may have various mapping methods. For example, a page mapping operation may be performed in the unit of page, a block mapping operation may be performed in the unit of memory block, or a hybrid mapping operation corresponding to a combination thereof may be performed.

The flash translation layer 2220 may be provided with the write request WRITEx or the read request READx through the host interface 2230 and may provide a program command PGM, an erase command ERS, or a read command READ to the flash interface 2210. The flash translation layer 2220 may provide a physical address together with the program, erase, or read command. The flash interface 2210 may provide the command CMD, the address ADDR, and the data "DATA" to the flash memory 2100 through the input/output line 10.

The flash memory 2100 may identify the command CMD, the address ADDR, and the data "DATA" through a combination of the control signals CTRL. For example, the flash memory 2100 may receive the command CMD in response to a command latch enable signal CLE and may receive the address ADDR in response to an address latch enable signal ALE. Also, the flash memory 2100 may receive or output the data "DATA" in response to a toggle of a write enable signal nWE or a read enable signal nRE.

Meanwhile, the user device 2000 according to an embodiment of the inventive concept may additionally support a data protection and recovery operation in addition to normal data write and read operations. Here, the data protection operation refers to an operation of setting data stored in a memory block of the flash memory 2100 to a read-impossible state. The data recovery operation refers to an operation of setting data stored in a memory block to a readable state.

Continuing to refer to FIG. 8, the host 2300 may provide a data protection request PROTx or a data recovery request RCVYx to the memory controller 2200. The flash translation layer (FTL) 2220 may receive the data protection request PROTx or the data recovery request RCVYx through the host interface 2230 and may provide a data protection command PROT or a data recovery command RCVY to the flash interface 2210. The flash translation layer (FTL) 2220 may provide the data protection command PROT or the data recovery command RCVY together with a physical address. Here, the physical address for data protection or data recovery may be a page address associated with the selection lines SSL and GSL and/or a dummy word line of the flash memory 2100. Alternatively, the physical address for data protection may be an address associated with the bit line BL or the word line WL of the flash memory 2100.

The flash interface 2210 may provide the command CMD and the address ADDR for data protection or recovery to the flash memory 2100 through the input/output line 10. The flash interface 2210 may identify the command CMD and the address ADDR for data protection or recovery through a combination of the control signals CTRL. Meanwhile, the flash interface 2210 may also provide the data "DATA" together with the command CMD and the address ADDR. Here, pieces of data to be provided to the flash memory 2100 may be the same.

III. Data Protection and Recovery Method of Flash Memory

1. Data Protection and Recovery Method Through SST Program of Flash Memory

Figure 9:
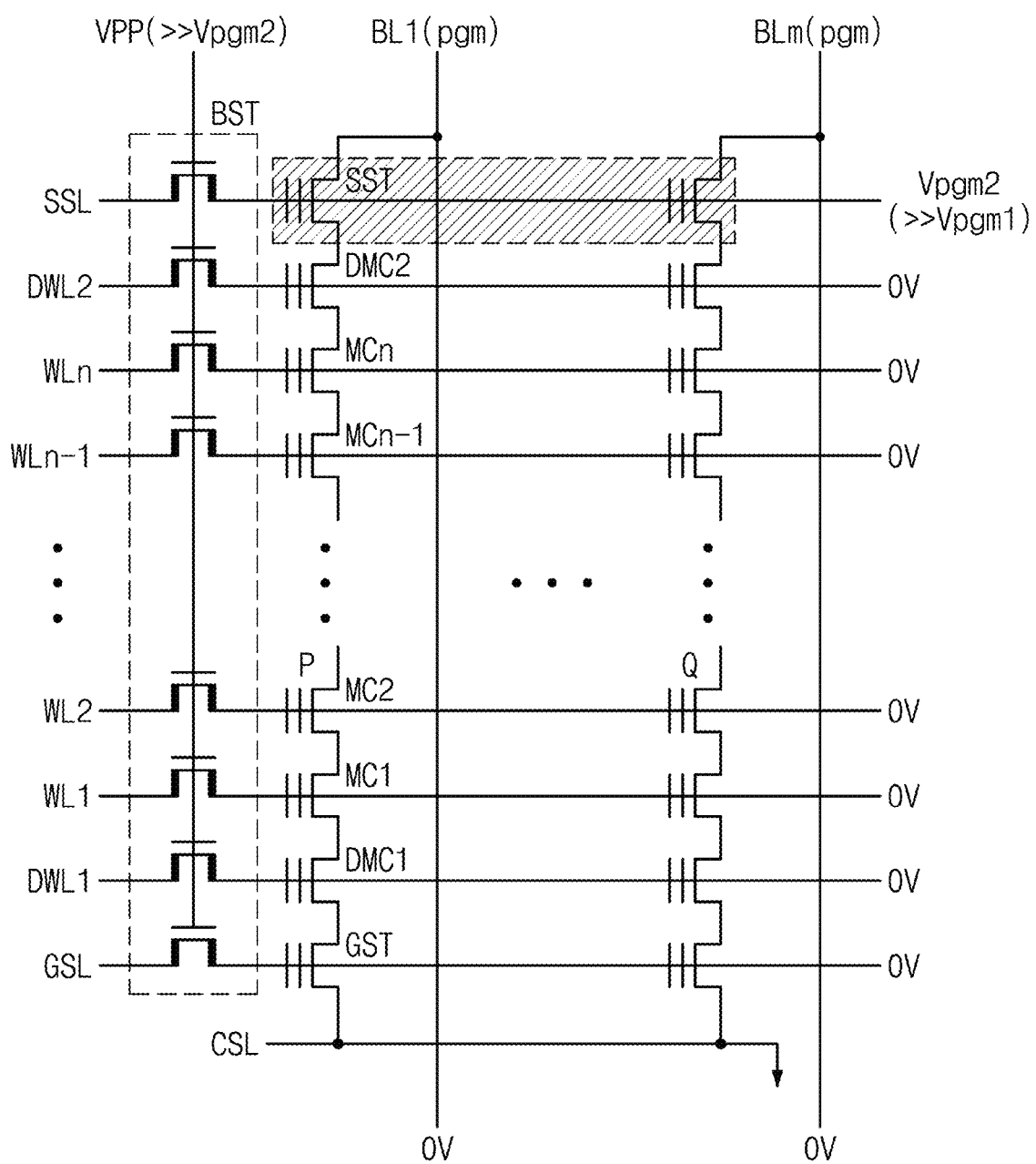
FIGS. 9 to 11 illustrate a data protection method through SST program of a flash memory illustrated in FIG. 8.
Figure 10:
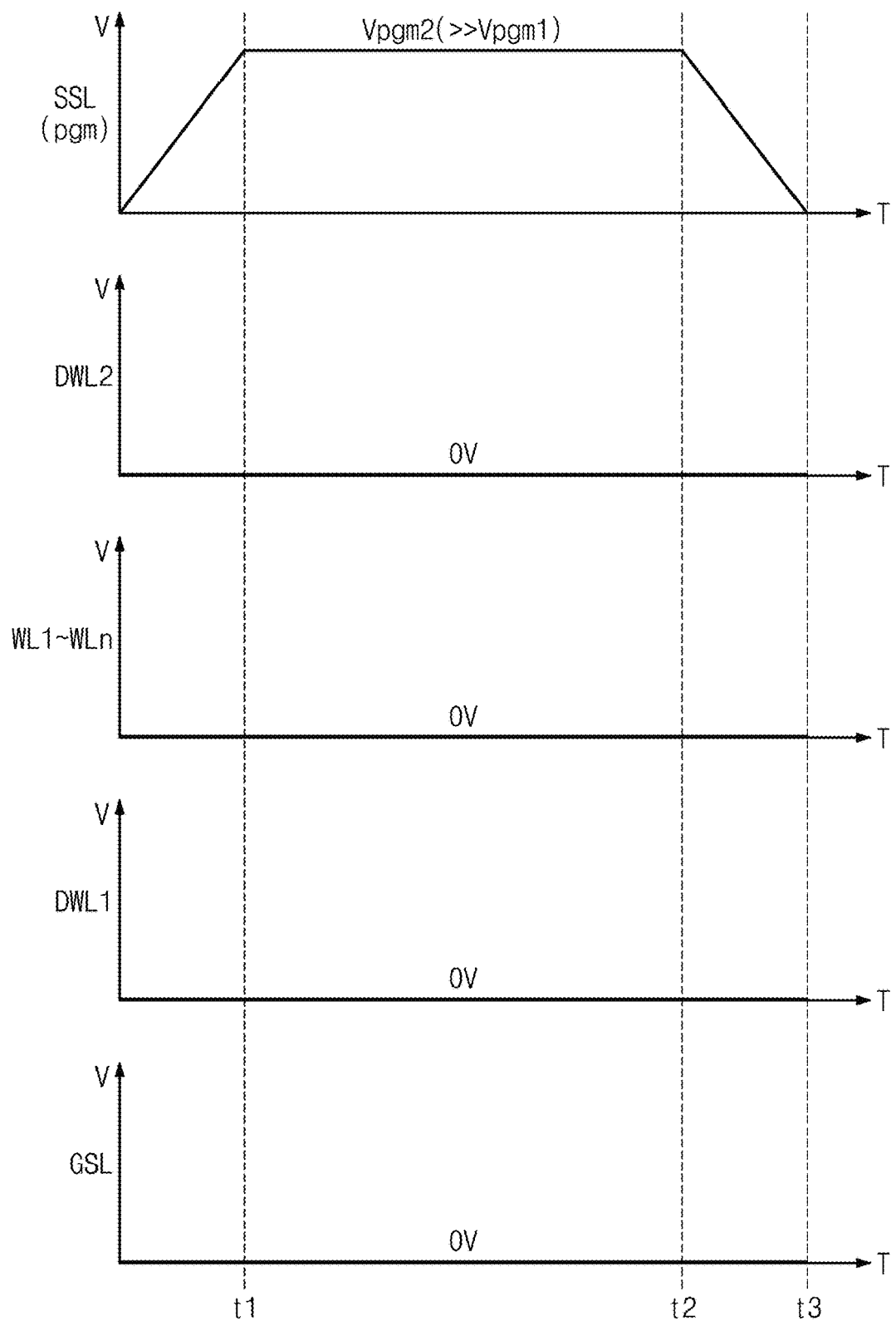
Figure 11:
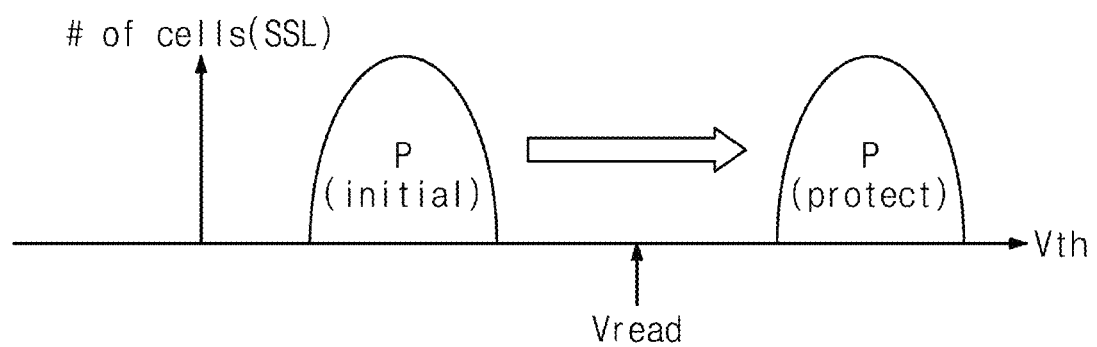

FIGS. 9 to 11 illustrate a data protection method through SST program of a flash memory illustrated in FIG. 8. The flash memory 2100 according to an embodiment of the inventive concept may protect page data stored in the memory cells "P" and "0" connected to the second word line WL2 by programming threshold voltages Vth of the string selection transistors SST to a voltage higher than the non-selection read voltage Vread. Below, a method of programming the string selection transistor SST (hereinafter referred to as "SST program") will be described.

Referring to FIG. 9, the flash memory 2100 may select a memory block through the plurality of block selection transistors BST. The high voltage VPP enough to turn on the block selection transistors BST is applied to the gates of the block selection transistors BST. A bit line program voltage of 0 V is provided to the first to m-th bit lines BL1 to BLm.

FIG. 10 illustrates an SST program bias condition of the flash memory 2100 illustrated in FIG. 9. Referring to FIGS. 9 and 10, in the SST program operation, a second program voltage Vpgm2 higher than a first program voltage Vpgm1 (refer to FIG. 6) is applied to the string selection line SSL.

Here, the first program voltage Vpgm1 is a voltage that is provided to a selected word line in a normal program operation. According to the ISPP manner, the first program voltage Vpgm1 may be gradually increased as a program loop progresses. The second program voltage Vpgm2 is a voltage that is higher than a voltage to be provided in a final program loop. 0 V is applied to the ground selection line GSL, the first and second dummy word lines DWL1 and DWL2, and the first to n-th word lines WL1 to WLn. The high voltage VPP higher than the second program voltage Vpgm2 is provided to the block selection transistors BST.

According to the SST program bias condition, because the second program voltage Vpgm2 is applied to gates of the string selection transistors SST and a channel voltage is 0 V, a strong electric field is formed between the gates of the string selection transistors SST and a channel. In this case, electrons that are present in channels of the string selection transistors SST are injected into floating gates thereof by the F-N tunneling.

FIG. 11 is a diagram illustrating a threshold voltage distribution of string selection transistors connected to the string selection line SSL after an SST program operation is performed. Referring to FIG. 7, a horizontal axis represents a threshold voltage Vth, and a vertical axis represents the number of string selection transistors.

The flash memory 2100 (refer to FIG. 9) programs string selection transistors connected to the string selection line SSL at the same time. As the SST program operation is performed, threshold voltages of the string selection transistors become higher than the non-selection read voltage Vread. Here, the second program voltage Vpgm2 may be defined as a voltage that is able to set a threshold voltage of a string selection transistor to be higher than the non-selection read voltage Vread. According to the SST program operation, a threshold voltage distribution of the string selection transistors is changed from an initial program state to a protection program state.

The flash memory 2100 according to an embodiment of the inventive concept may receive the data protection command PROT from the memory controller 2200 (refer to FIG. 8) and may perform the SST program operation. The flash memory 2100 may set threshold voltages of the string selection transistors to be higher than the non-selection read voltage Vread through the SST program operation.

In a normal read operation of the flash memory 2100, the selection read voltage Vrd1, Vrd2, etc. may be provided to the selected word line WL2, and the non-selection read voltage Vread may be provided to the remaining word lines and the string selection line SSL. The flash memory 2100 according to an embodiment of the inventive concept may prevent the string selection transistors from being turned on in the read operation by performing the SST program operation. The reason is that the threshold voltages of the string selection transistors are higher than the non-selection read voltage Vread to be provided to the string selection line SSL.

Because the flash memory 2100 according to an embodiment of the inventive concept only adjusts the threshold voltages of the string selection transistors through the SST program operation, the flash memory 2100 may protect data within a short time without an additional hardware change.

FIGS. 12 to 17 illustrate a data recovery method through SST erase and reprogram of a flash memory illustrated in FIG. 8. The flash memory 2100 according to an embodiment of the inventive concept may protect data by programming the threshold voltages Vth of the string selection transistors SST to a voltage higher than the non-selection read voltage Vread. The flash memory 2100 according to an embodiment of the inventive concept may easily recover protected data through SST erase and reprogram.

Figure 12:
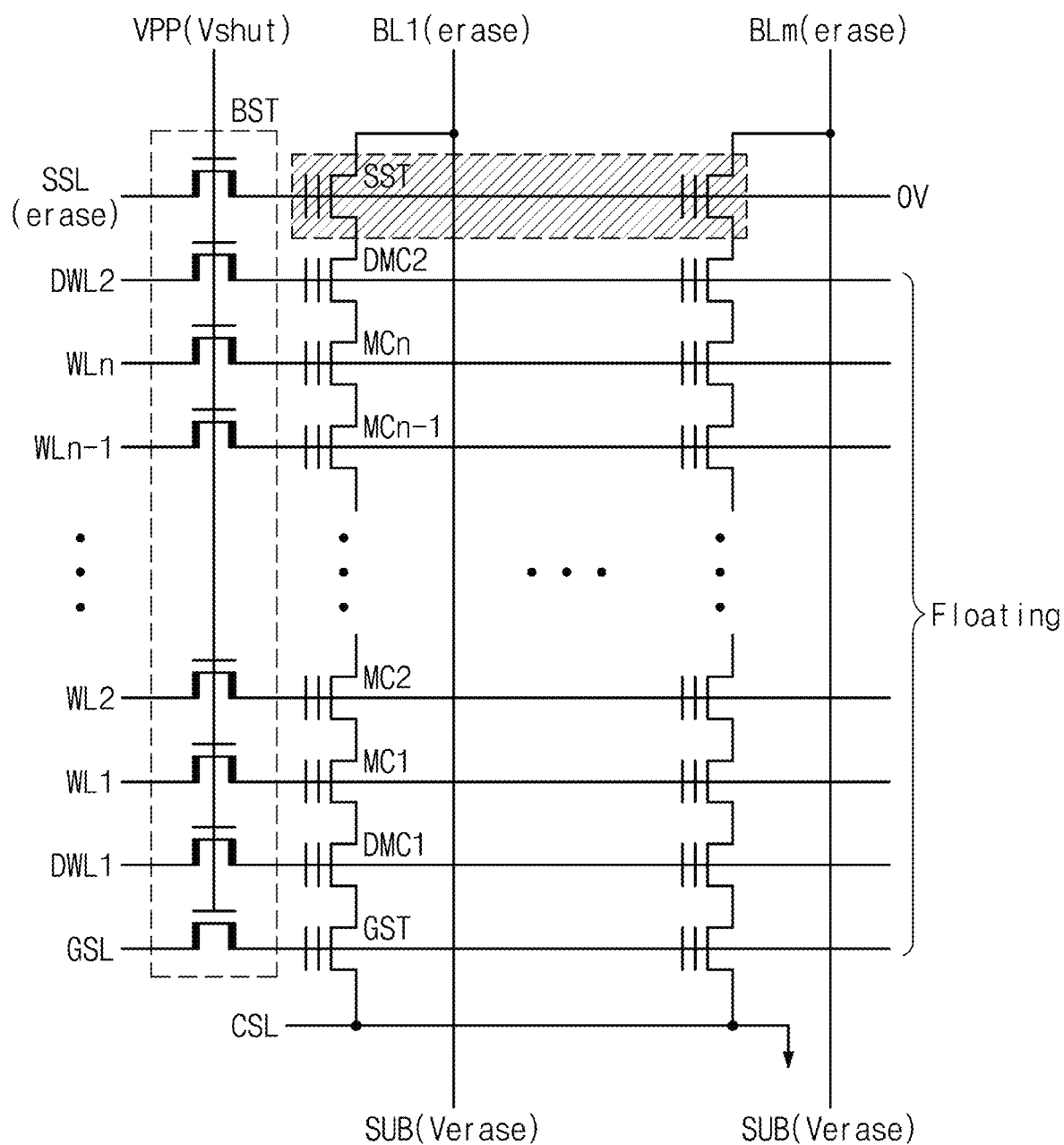
FIGS. 12 and 13 illustrate an SST erase bias condition of a flash memory 2100 illustrated in FIG. 9.
Figure 13:
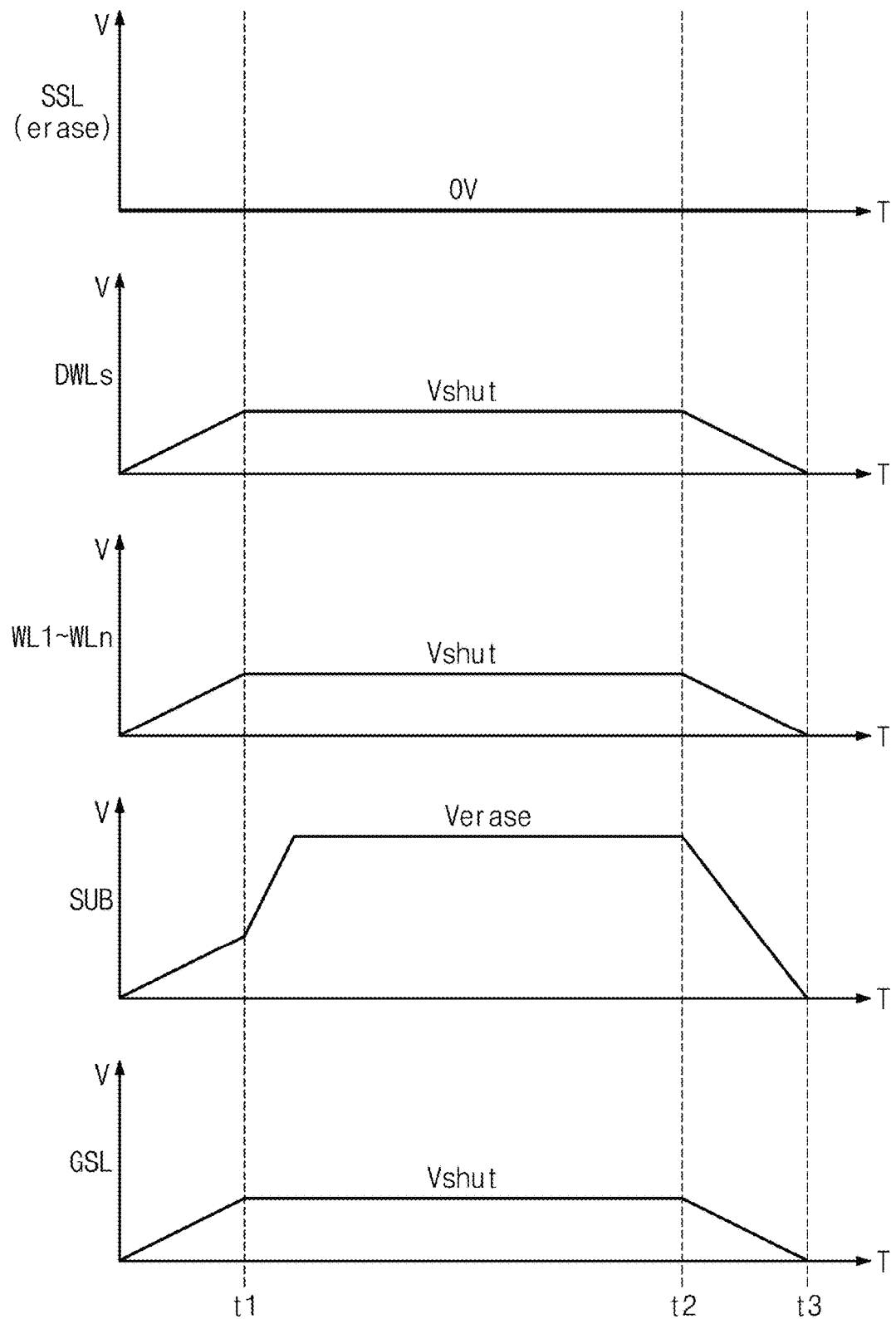

FIGS. 12 and 13 illustrate an SST erase bias condition of the flash memory 2100 illustrated in FIG. 9. Referring to FIGS. 12 and 13, in an SST erase operation, 0 V is applied to the string selection line SSL. The ground selection line GSL, the word lines WL1 to WLn and the dummy word lines DWL1 and DWL2 are set to a floating state.

In the case of increasing voltages of the ground selection line GSL, the word lines WL1 to WLn and the dummy word lines DWL1 and DWL2 in a state where a shut-off voltage Vshut is applied to the gates of the block selection transistors BST, when the increased voltage reaches a voltage of (Vshut−Vth) corresponding to the shut-off voltage Vshut minus a threshold voltage of the block selection transistor BST, the block selection transistors BST may be shut off. In this case, the ground selection line GSL, the word lines WL1 to WLn and the dummy word lines DWL1 and DWL2 may be set to a floating state.

In the SST erase operation, an erase voltage Verase is applied to the substrate SUB. For example, the erase voltage Verase may be about 20 V. According to the SST erase bias condition, because 0 V is applied to the gates of the string selection transistors SST and the erase voltage Verase of about 20 V is applied to a channel, a strong electric field is formed between the gates of the string selection transistors SST and the channel. In this case, electrons that are present in the floating gates of the string selection transistors SST are injected into the channel by the F-N tunneling.

Meanwhile, because the ground selection line GSL, the word lines WL1 to WLn and the dummy word lines DWL1 and DWL2 are in the floating state, gate voltages of cell transistors connected thereto increase to a boosting level (e.g., about 8 V) by the capacitive boosting effect formed between gates of the cell transistors and the channel. Because an electric field enough to form the F-N tunneling is not formed between the gates of the cell transistors and the channel, data stored in memory cells are not erased.

Figure 14:
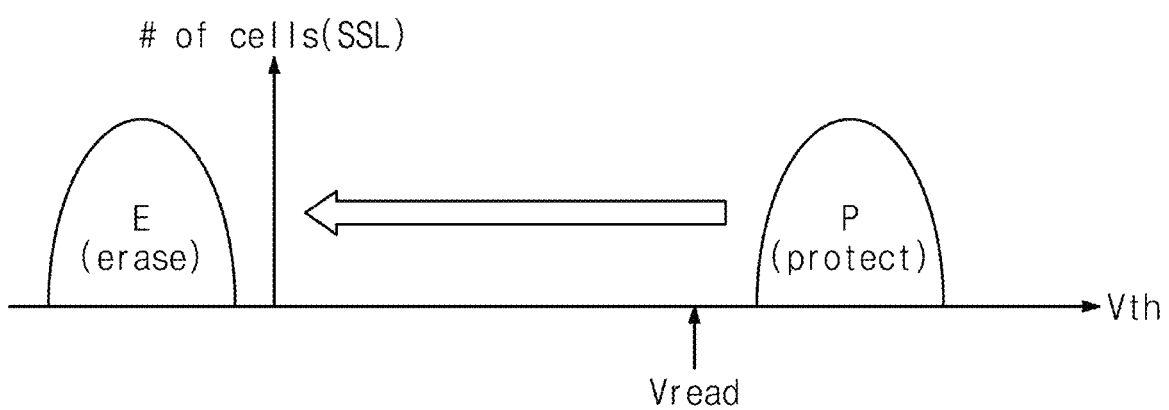
FIG. 14 is a diagram illustrating a threshold voltage distribution of string selection transistors connected to a string selection line SSL after an SST erase operation is performed.

FIG. 14 is a diagram illustrating a threshold voltage distribution of string selection transistors connected to the string selection line SSL after an SST erase operation is performed. The flash memory 2100 (refer to FIG. 9) erases string selection transistors connected to the string selection line SSL at the same time. As the SST erase operation is performed, threshold voltages of the string selection transistors become lower than the non-selection read voltage Vread. According to the SST erase operation, a threshold voltage distribution of the string selection transistors is changed from the protection program state to an erase state.

Figure 15:
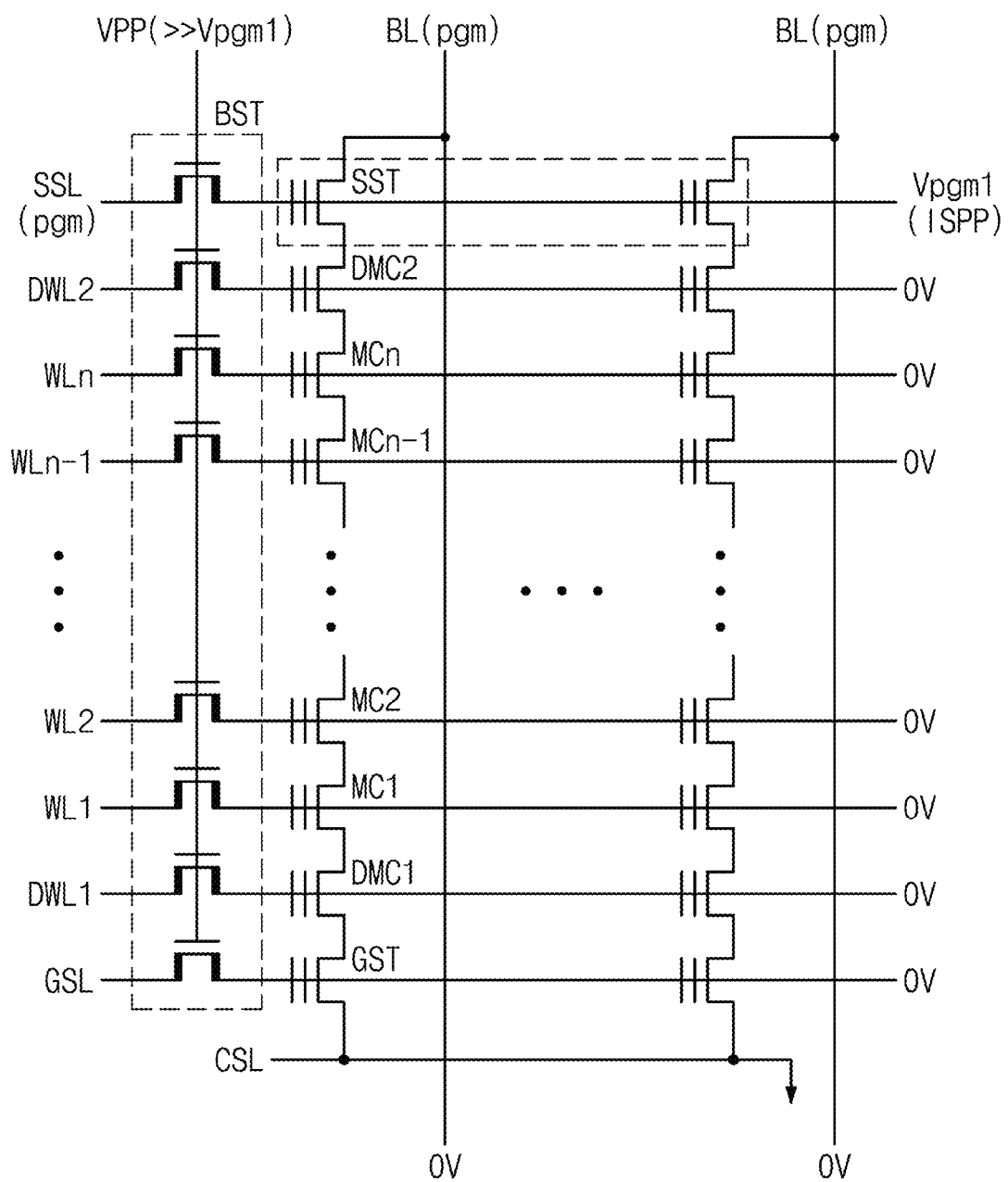
FIGS. 15 and 16 illustrate an SST reprogram bias condition of the flash memory 2100 illustrated in FIG. 9.
Figure 16:
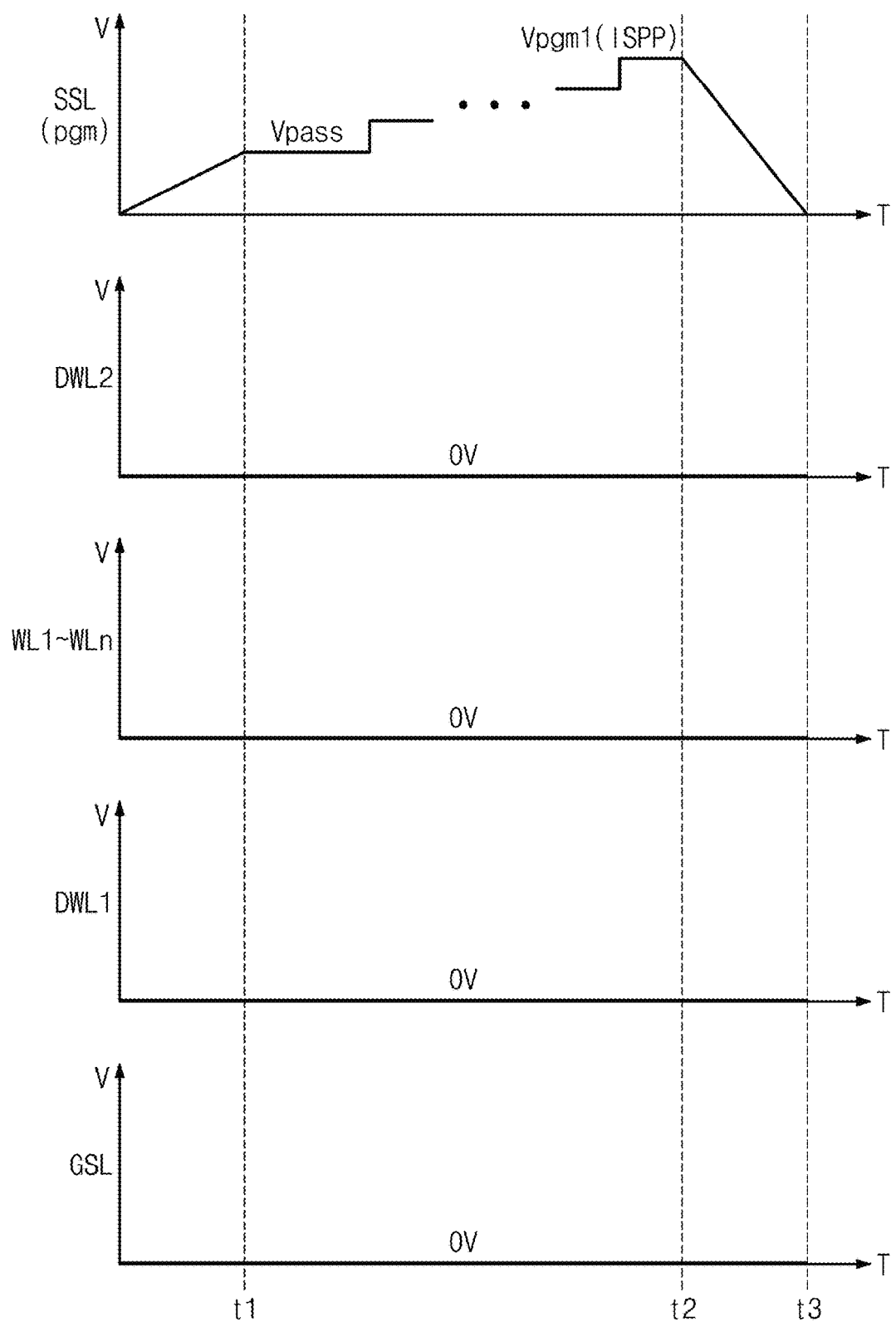

FIGS. 15 and 16 illustrate an SST reprogram bias condition of the flash memory 2100 illustrated in FIG. 9. Referring to FIGS. 15 and 16, in the SST reprogram operation, the first program voltage Vpgm1 (refer to FIG. 6) may be applied to the string selection line SSL.

The first program voltage Vpgm1 is a voltage that is provided to a selected word line in a normal program operation. According to the ISPP manner, the first program voltage Vpgm1 may be gradually increased as a program loop progresses. The first program voltage Vpgm1 may continue to progress until threshold voltages of all the string selection transistors SST are higher than a program verify voltage Vfy. 0 V is applied to the ground selection line GSL, the first and second dummy word lines DWL1 and DWL2, and the first to n-th word lines WL1 to WLn. The high voltage VPP higher than the first program voltage Vpgm1 is provided to the block selection transistors BST.

According to the SST reprogram bias condition, because the first program voltage Vpgm1 is applied to gates of the string selection transistors SST and a channel voltage is 0 V, a strong electric field is formed between the gates of the string selection transistors SST and a channel. In this case, electrons that are present in channels of the string selection transistors SST are injected into floating gates thereof by the F-N tunneling.

Figure 17:
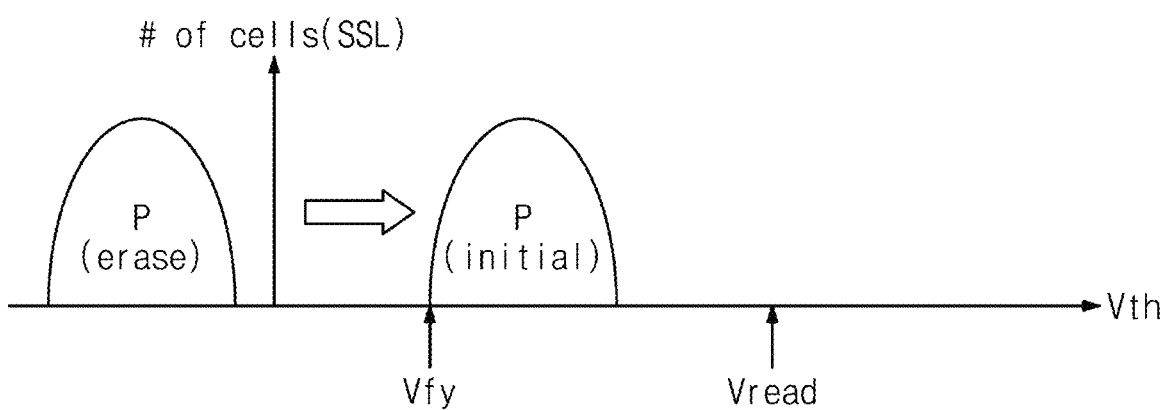
FIG. 17 is a diagram illustrating a threshold voltage distribution of string selection transistors connected to the string selection line SSL after an SST reprogram operation is performed.

FIG. 17 is a diagram illustrating a threshold voltage distribution of string selection transistors connected to the string selection line SSL after an SST reprogram operation is performed. The flash memory 2100 (refer to FIG. 9) programs string selection transistors connected to the string selection line SSL at the same time. As the SST reprogram operation is performed, threshold voltages of the string selection transistors become higher than the program verify voltage Vfy. According to the SST reprogram operation, a threshold voltage distribution of the string selection transistors is changed from the erase state to an initial program state.

The flash memory 2100 according to an embodiment of the inventive concept may receive the data recovery command RCVY from the memory controller 2200 (refer to FIG. 8) and may perform the SST erase and program operation. The flash memory 2100 may set threshold voltages of the string selection transistors to an erase state through the SST erase operation and may set the threshold voltages thereof to an initial program state through the SST reprogram operation.

In the read operation of the flash memory 2100, the selection read voltage Vrd1, Vrd2, etc. may be provided to a selected word line (e.g., WL2), and the non-selection read voltage Vread may be provided to the remaining word lines and the string selection line SSL. The flash memory 2100 according to an embodiment of the inventive concept may perform the SST erase and reprogram operations such that, in the read operation, the string selection transistors are turned on and the read operation is normally performed.

Because the flash memory 2100 according to an embodiment of the inventive concept only adjusts the threshold voltages of the string selection transistors through the SST erase and reprogram operations, the flash memory 2100 may recover data within a short time without an additional hardware change.

As described above, the flash memory 2100 according to an embodiment of the inventive concept may perform the data protection operation through the SST program operation and may perform the data recovery operation through the SST erase and reprogram operation.

Meanwhile, the flash memory 2100 according to an embodiment of the inventive concept may perform the data protection operation and the data recovery operation through the ground selection transistors GST. The inventive concept may perform the data protection operation through a GST program operation and may perform the data recovery operation through a GST erase and reprogram operation. The GST program operation and the GST erase and reprogram operation may be performed in the same manner as the SST program operation and the SST erase and reprogram operation described above.

2. Data Protection Method Through SST and DWC Program of Flash Memory

The flash memory 2100 (refer to FIG. 8) according to an embodiment of the inventive concept may not recover data permanently depending on a need of the user. The flash memory 2100 may support a function of destroying data by blocking an access to particular data permanently. To this end, the inventive concept may further support a dummy memory cell program operation (hereinafter referred to as a "DMC program operation") in addition to the SST program operation.

Figure 18:
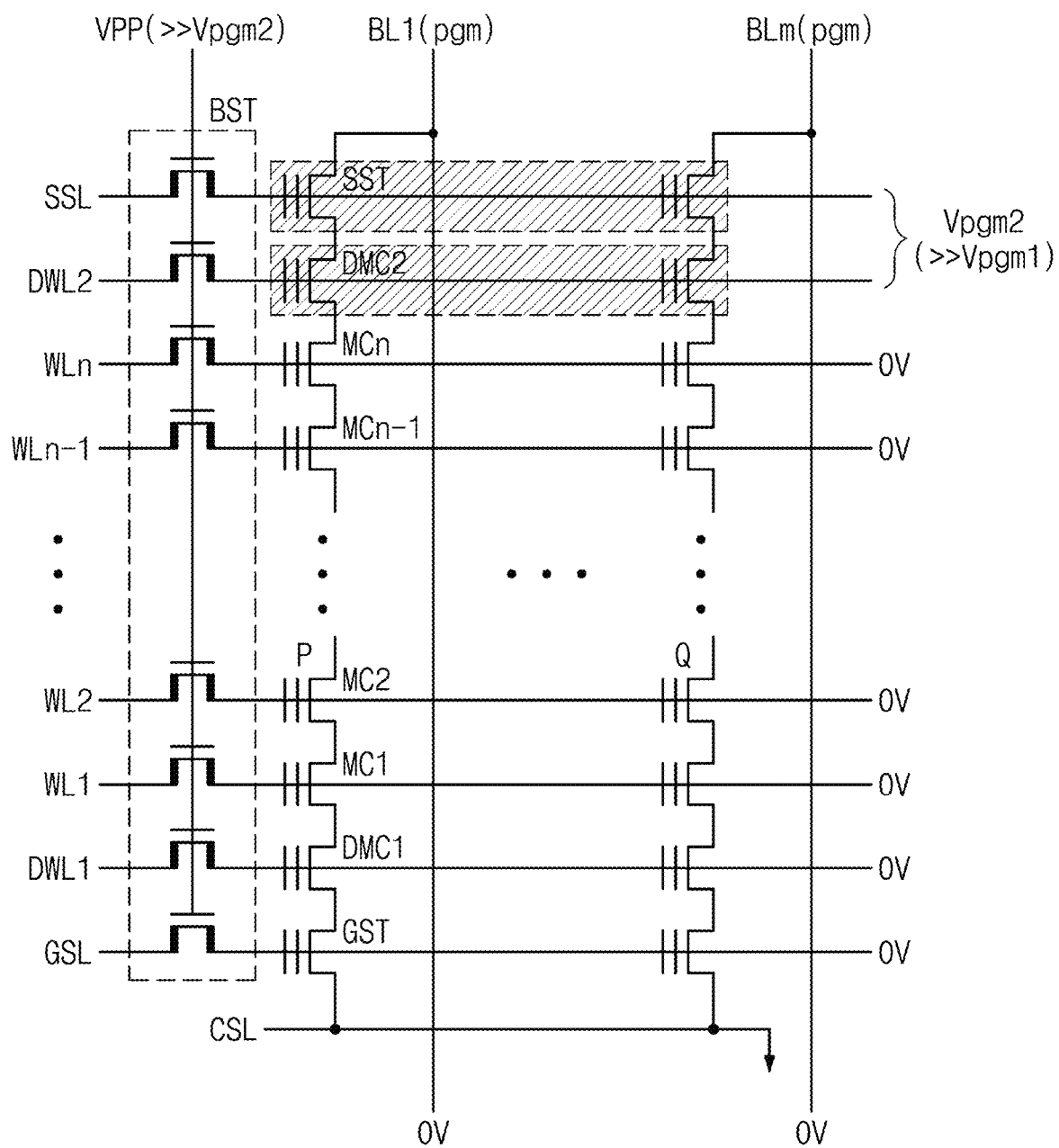
FIGS. 18 to 20 illustrate a permanent data protection method through SST and DMC program of a flash memory illustrated in FIG. 8.
Figure 19:
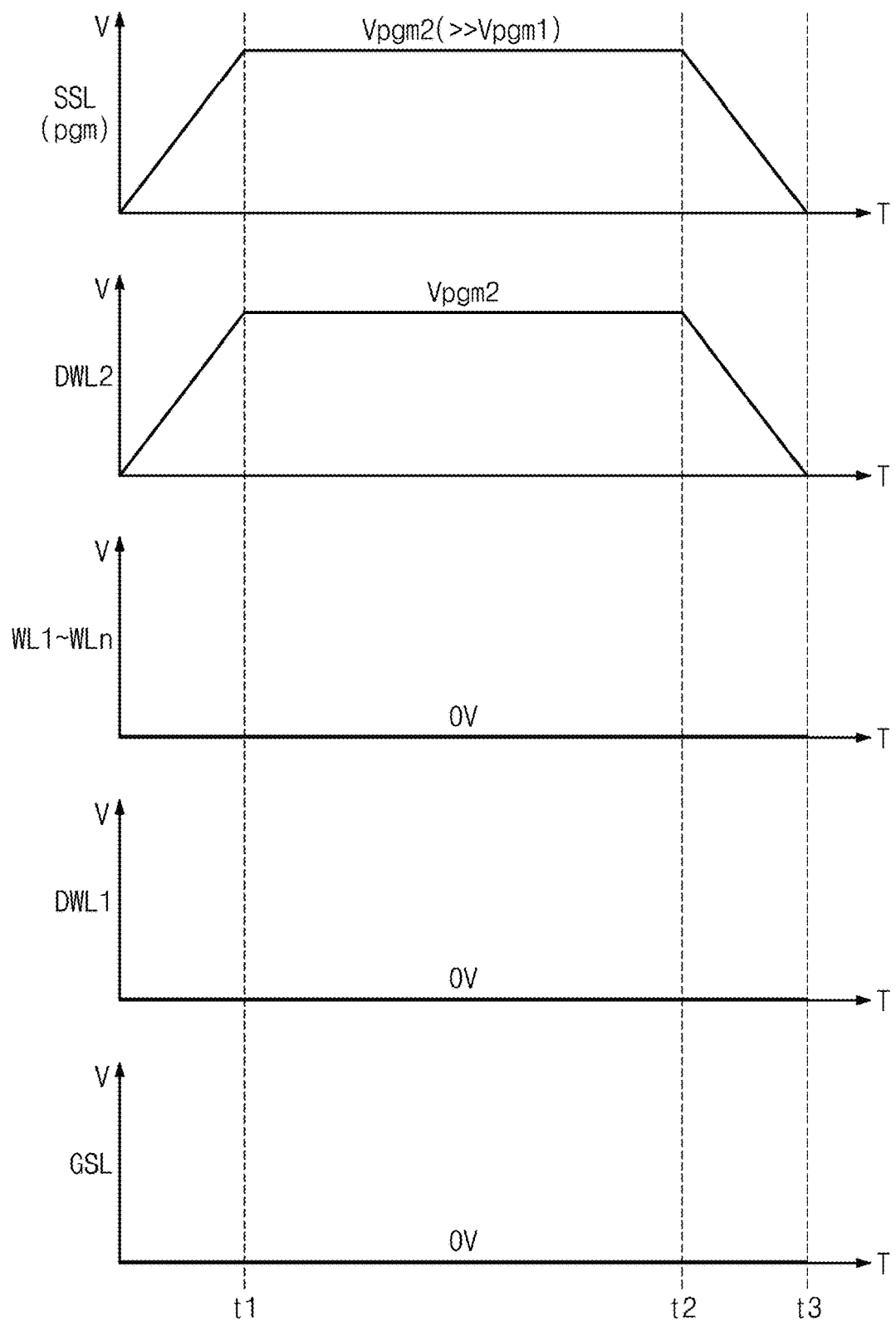
Figure 20:
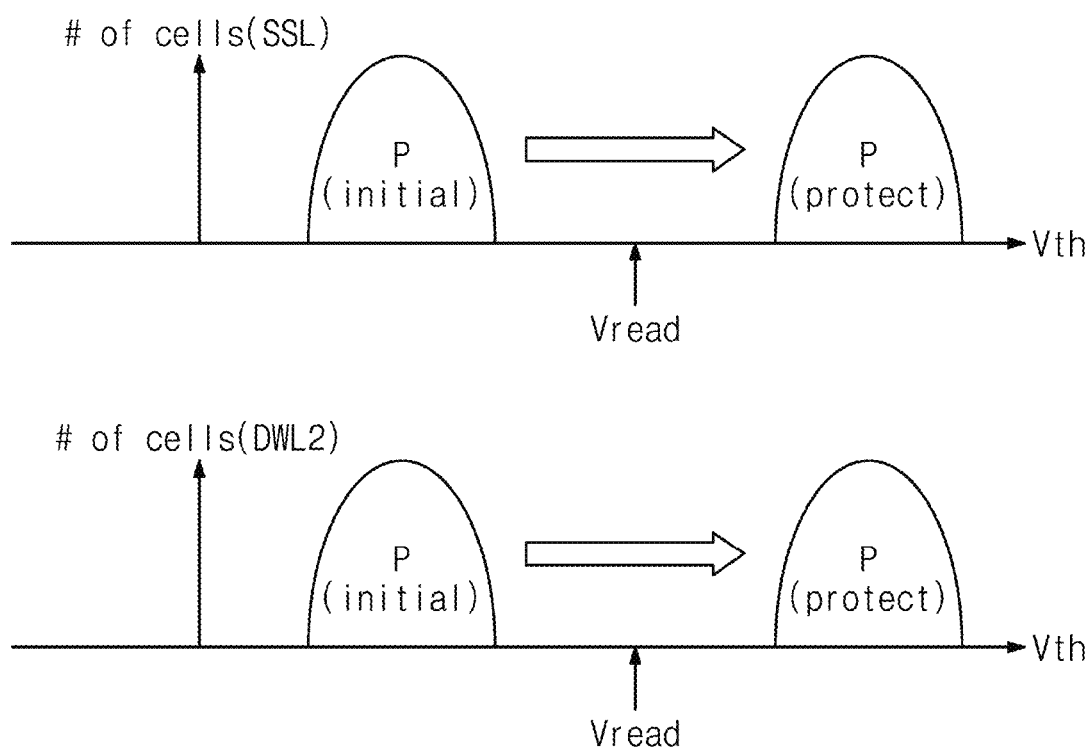

FIGS. 18 to 20 illustrate a permanent data protection method through SST and DMC program of a flash memory illustrated in FIG. 8. Referring to FIGS. 18 and 19, in the SST and DMC program operation, the second program voltage Vpgm2 higher than the first program voltage Vpgm1 (refer to FIG. 6) is applied to the string selection line SSL and the second dummy word line DWL2.

According to the SST and DMC program bias condition, because the second program voltage Vpgm2 is applied to the string selection line SSL and the second dummy word line DWL2 and a channel voltage is 0 V, a strong electric field is formed between the gates of the string selection transistors SST and the second dummy memory cells DMC2 and channels. In this case, electrons that are present in the channels of the string selection transistors SST and the second dummy memory cells DMC2 are injected into floating gates thereof by the F-N tunneling.

FIG. 20 is a diagram illustrating threshold voltage distributions of the string selection transistors SST and the second dummy memory cells DMC2 after an SST and DMC program operation is performed. As the SST and DMC program operation is performed, threshold voltages of string selection transistors and second dummy memory cells become higher than the non-selection read voltage Vread. According to the SST and DMC program operation, threshold voltage distributions of the string selection transistors and the dummy memory cells are changed from an initial program state to a protection program state.

The flash memory 2100 according to an embodiment of the inventive concept may provide a program operation only with regard to the dummy word line DWL and may not support an erase and reprogram operation. As such, the flash memory 2100 may permanently block or restrict an access to data stored in program cells "P" and "0".

In this case, the inventive concept may perform the data protection and recovery operation through the SST program operation in the case of restricting an access to data temporarily and recovering data at a desired time, and may protect data through the SST and DMC program operation in the case of restricting an access to data permanently.

3. Data Protection and Recovery Method Through DMC Program of Two-Dimensional Flash Memory As described above, because the selection transistors SST and GST have the same structure as a memory cell storing data, a three-dimensional flash memory may adjust a threshold voltage Vth through a program or erase operation. In contrast, because selection transistors SST and GST to select a cell string are equal or similar in structure to an NMOS transistor and a threshold voltage Vth is determined in a process procedure, a two-dimensional flash memory fails to adjust the threshold voltage Vth.

However, the two-dimensional flash memory may protect data by programming a threshold voltage of at least one of a plurality of memory cells connected between the string selection transistor SST and the ground selection transistor GST to be the non-selection read voltage Vread or higher. Also, the two-dimensional flash memory may recover data through erase and reprogram.

In general, the two-dimensional flash memory starts a program operation from a memory cell adjacent to the ground selection transistor GST. That is, the program operation is performed in the order of memory cells connected to a first word line WL1 to memory cells connected to an n-th word line WLn. This is called a "Min-Max program operation". Accordingly, preferably, a memory cell that is targeted for the data protection and recover operation may be a memory cell MC or a dummy memory cell DMC, which is adjacent to a string selection transistor.

A conventional flash memory requires a lot of time to protect and recover data. The reason is that it is necessary to erase all data stored in a memory block and perform a program operation. However, the inventive concept may adjust a threshold voltage of a string selection transistor through the SST program operation without affecting data stored in a memory cell, thus protecting and recovering data easily and quickly.

4. Data Protection Method Through Change of Read Operation Condition of Flash Memory FIGS. 21 to 24 illustrate a data protection method different from the data protection method described with reference to FIGS. 9 to 11. The flash memory 2100 according to an embodiment of the inventive concept may protect page data stored in memory cells connected to a selection word line (e.g., the second word line WL2) by adjusting a voltage to be applied to the bit lines BL1 to BLm or unselected word lines in a data read operation. Below, there will be described a method that protects data by adjusting a voltage to be applied to bit lines or unselected word lines.

Figure 21:
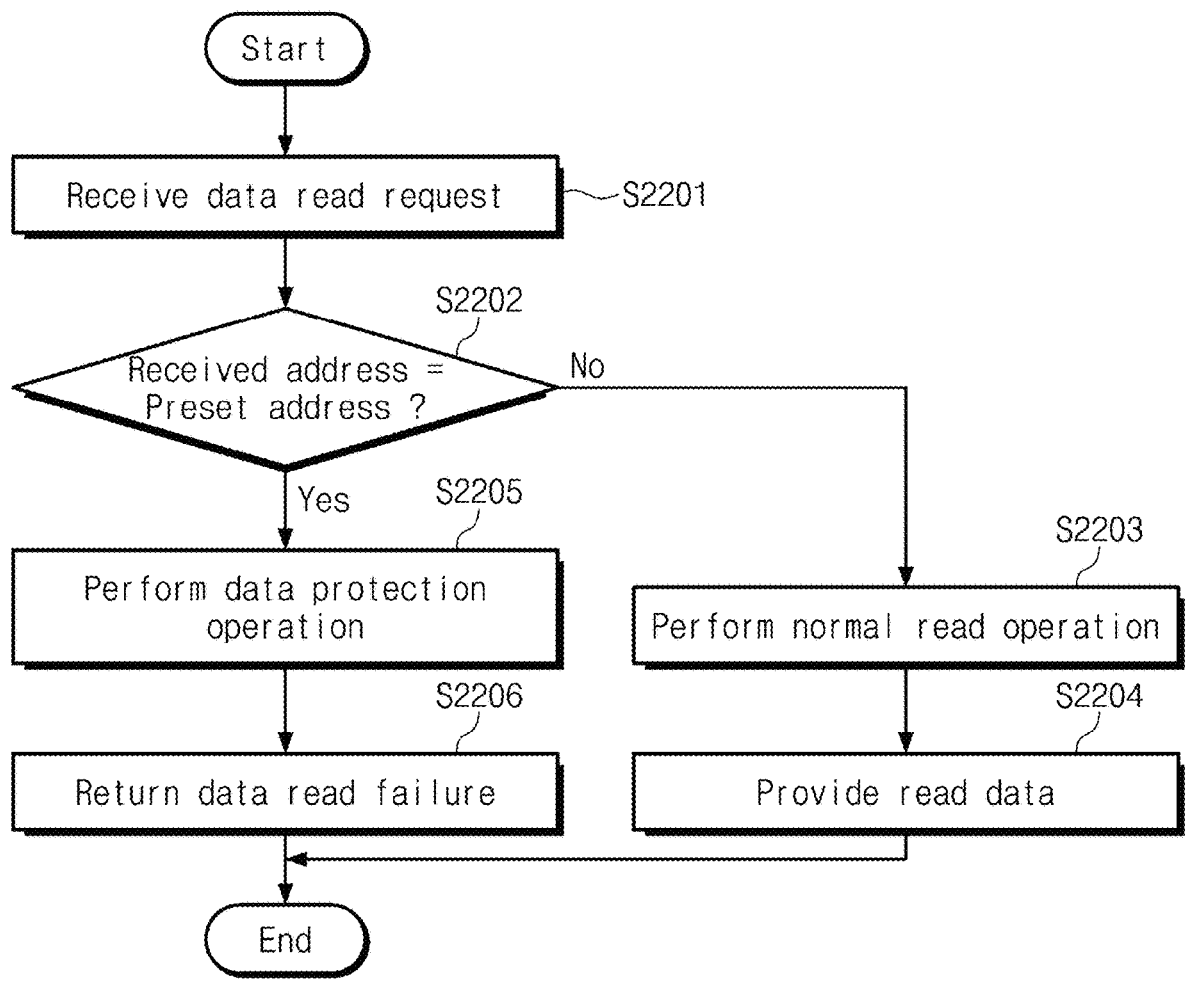
FIG. 21 is a flowchart illustrating an operation in which a memory controller 2200 of FIG. 8 protects data in a data read operation.

FIG. 21 is a flowchart illustrating an operation in which the memory controller 2200 of FIG. 8 protects data in a data read operation. Referring to FIGS. 8 and 21, in operation S2201, the memory controller 2200 may receive the data read request READx from the host 2300. The memory controller 2200 may receive a logical address together with the read request.

In operation S2202, the memory controller 2200 may determine whether the received address is matched with a preset address. The preset address may be a block address at which data for protection are stored. When the received address is matched with the preset address, read data requested from the host 2300 may be included in the data for protection. For example, the preset address may be in advance stored in the memory controller 2200 after set by the host 2300, but the inventive concept is not limited thereto.

When the received address is not matched with the preset address, in operation S2203, the memory controller 2200 may perform a normal read operation. That is, because the read data are not data for protection, the memory controller 2200 may output the read data stored in the flash memory 2100. In operation S2204, the memory controller 2200 may provide the output read data to the host 2300.

When the received address is matched with the preset address, in operation S2205, the memory controller 2200 may perform a data protection operation. Because the read data are data for protection, the memory controller 2200 may allow the flash memory 2100 to perform the data protection operation. According to the data protection operation, a data read operation of the flash memory 2100 may fail. As such, in operation S2206, the memory controller 2200 may return a data read failure message to the host 2300.

Figure 22:
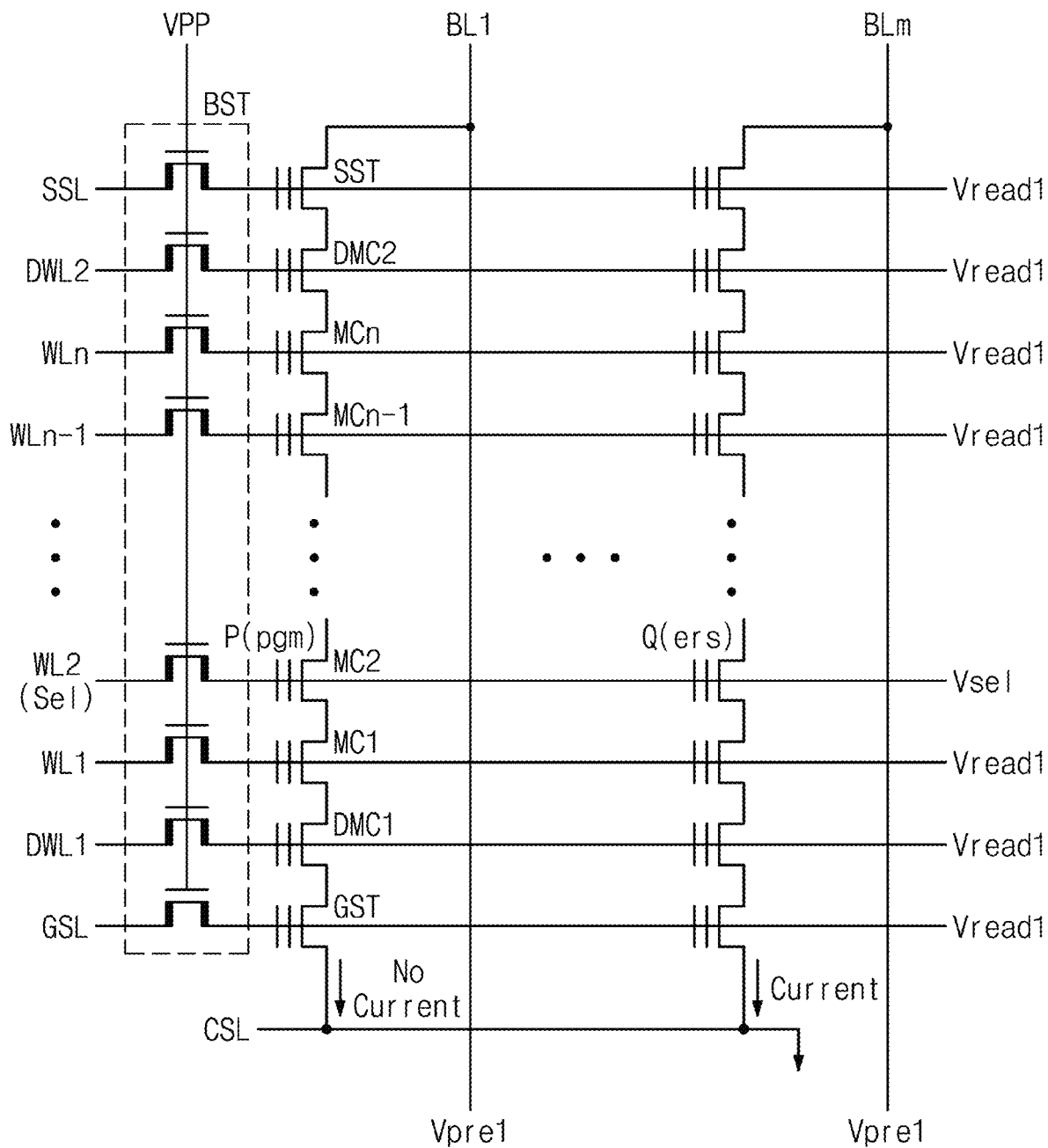
FIG. 22 illustrates an operation of the flash memory 2100 for a normal read operation of FIG. 21.

FIG. 22 illustrates an operation of the flash memory 2100 for a normal read operation of FIG. 21. The flash memory 2100 may receive a read command from the memory controller 2200 and may perform a normal read operation.

For convenience of description, it is assumed that the second word line WL2 is selected to read data stored in the flash memory 2100, the memory cell "P" connected to the second word line WL2 is in a programmed state, and the memory cell "0" is in an erased state. Referring to FIG. 22, the high voltage VPP enough to turn on the block selection transistors BST is applied to gates of the block selection transistors BST. A selection read voltage Vsel is provided to the selected word line WL2, and a first non-selection read voltage Vread1 is provided to unselected word lines WL1 and WL3 to WLn. Likewise the unselected word lines WL1 and WL3 to WLn, the first non-selection read voltage Vread1 is applied to the dummy word lines DWL1 and DWL2 and the selection lines SSL and GSL. A first precharge voltage Vpre1 is applied to the bit lines BL1 to BLm.

For example, to perform the normal read operation, the first non-selection read voltage Vread1 may be about 6 V, and the first pre-charge voltage Vpre1 may be about 1.3 V to 1.4 V. However, the inventive concept is not limited thereto.

When the selection read voltage Vsel is applied to a gate of the memory cell "P" of the programmed state, the memory cell "P" may be turned off. When the first non-selection read voltage Vread1 is applied to gates of memory cells, the memory cells may be turned on. That is, under the bias condition of the normal read operation, the memory cell "P" among the memory cells connected in series to the first bit line BL1 may be in an off state. As such, a current may not flow through the first bit line BL1 to which the memory cell "P" is connected.

When the selection read voltage Vsel is applied to a gate of the memory cell "0" of the erased state, the memory cell "0" may be turned on. Likewise, when the first non-selection read voltage Vread1 is applied to gates of memory cells, the memory cells may be turned on. That is, under the bias condition of the normal read operation, all the memory cells connected in series to the m-th bit line BLm may be in an on state. As such, a current may flow through the m-th bit line BLm to which the memory cell "0" is connected.

The flash memory 2100 may read data stored in the memory cells "P" and "Q" based on currents respectively flowing to the first bit line BL1 and the m-th bit line BLm. The flash memory 2100 may provide the read data to the memory controller 2200. As such, the memory controller 2200 may provide the read data to the host 2300.

Figure 23:
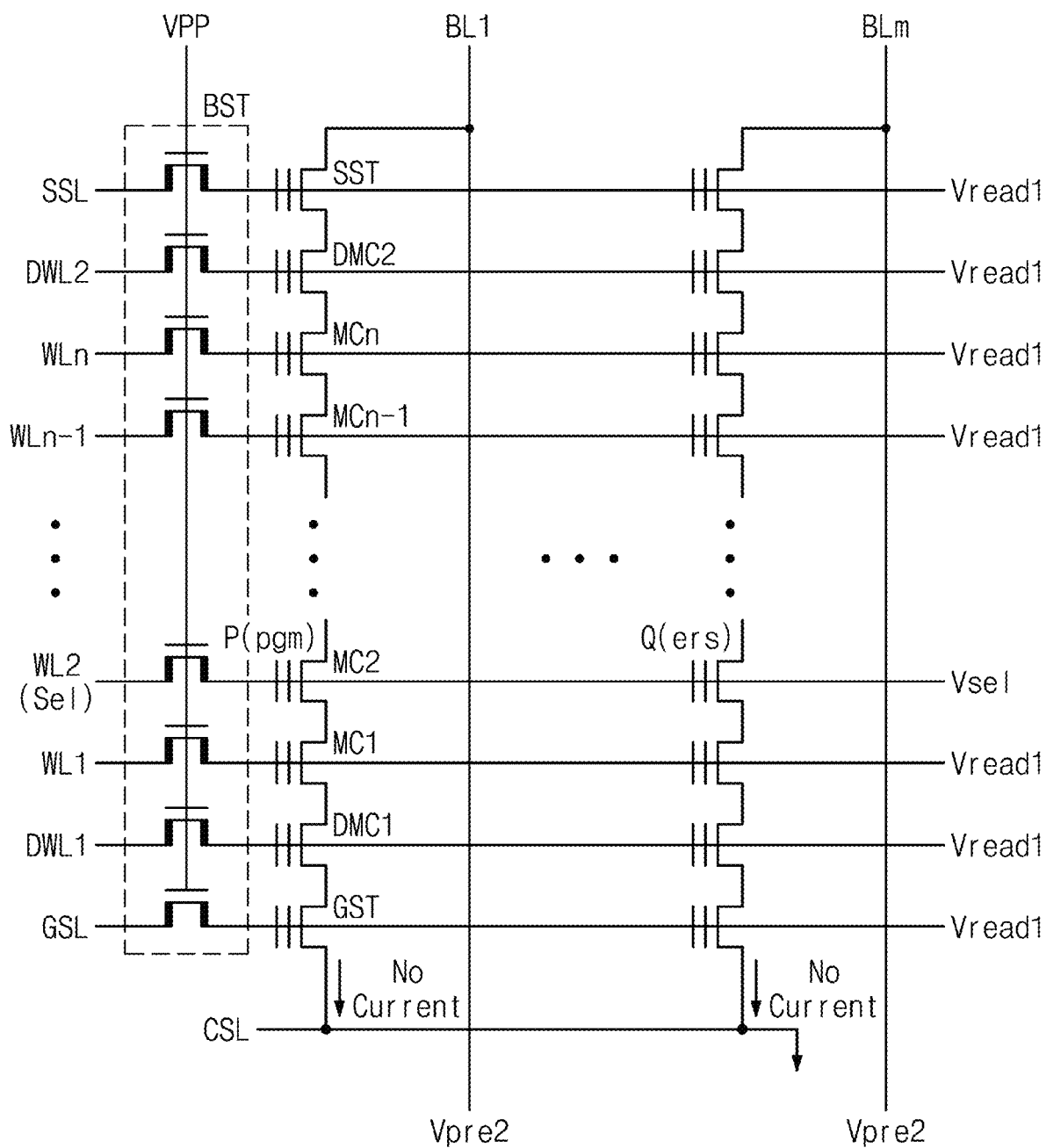
FIGS. 23 and 24 illustrate an operation of the flash memory 2100 for a data protection operation of FIG. 21.
Figure 24:
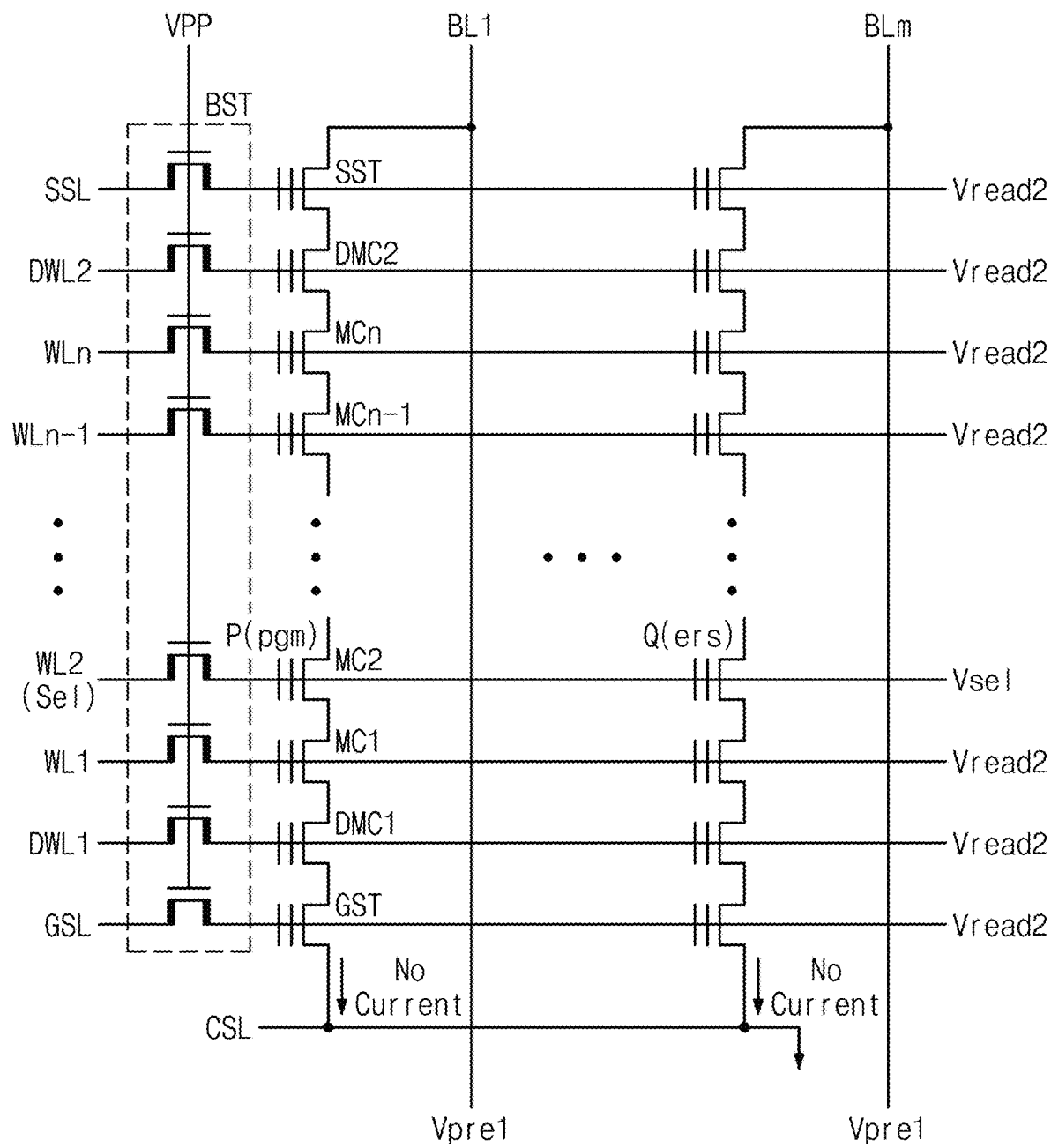

FIGS. 23 and 24 illustrate an operation of the flash memory 2100 for a data protection operation of FIG. 21. In detail, FIG. 13 shows an example of performing a data protection operation by differently setting a voltage to be applied to the bit lines BL1 to BLm, and FIG. 14 shows an example of performing the data protection operation by differently setting the non-selection read voltage Vread. The flash memory 2100 may receive a data protection command from the memory controller 2200 and may perform the data protection operation.

Referring to FIG. 23, the high voltage VPP enough to turn on the block selection transistors BST is applied to gates of the block selection transistors BST. The selection read voltage Vsel is provided to the selected word line WL2, and the first non-selection read voltage Vread1 is provided to unselected word lines WL1 and WL3 to WLn. Like the unselected word lines WL1 and WL3 to WLn, the first non-selection read voltage Vread1 is applied to the dummy word lines DWL1 and DWL2 and the selection lines SSL and GSL. A second pre-charge voltage Vpre2 is applied to the bit lines BL1 to BLm. The second pre-charge voltage Vpre2 may be a voltage smaller than the first pre-charge voltage Vpre1. For example, the second pre-charge voltage Vpre2 may be 0 V. However, the inventive concept is not limited thereto. For example, the second pre-charge voltage Vpre2 may be any voltage that makes it impossible to determine data stored in a memory cell based on currents flowing through the bit lines BL1 to BLm.

When the second pre-charge voltage Vpre2 is applied, a current may not flow through the bit lines BL1 to BLm. Alternatively, when the second pre-charge voltage Vpre2 is applied, a small current may flow through the bit lines BL1 to BLm such that data stored in a memory cell are not determined.

As described above, when the second pre-charge voltage Vpre2 is applied to the bit lines BL1 to BLm, a current may not flow to the bit lines BL1 to BLm (or a current flowing to the bit lines BL1 to BLm is small), and thus, memory cells connected to the bit lines BL1 to BLm may be recognized as an off state. Accordingly, an error may occur in data read from the flash memory 2100. The memory controller 2200 may determine a memory block, which includes memory cells at which an error occurs, as a bad block. As such, the memory controller 2200 may return a data read failure message to the host 2300.

Referring to FIG. 24, the high voltage VPP enough to turn on the block selection transistors BST is applied to the gates of the block selection transistors BST. The selection read voltage Vsel is provided to the selected word line WL2, and a second non-selection read voltage Vread2 is provided to unselected word lines WL1 and WL3 to WLn. Like the unselected word lines WL1 and WL3 to WLn, the second non-selection read voltage Vread2 is applied to the dummy word lines DWL1 and DWL2 and the selection lines SSL and GSL. The first pre-charge voltage Vpre1 is applied to the bit lines BL1 to BLm. The second non-selection read voltage Vread2 may be a voltage smaller than the first non-selection read voltage Vread1. For example, the second non-selection read voltage Vread2 may be 0 V or about 1 V to 2 V. However, the inventive concept is not limited thereto. For example, the second non-selection read voltage Vread2 may be any voltage that allows a memory cell to maintain an off state. A memory cell to which the second non-selection read voltage Vread2 is applied may be turned off. As such, a current may not flow through the bit lines BL1 to BLm.

As described above, when the second non-selection read voltage Vread2 is applied to the unselected word lines WL1 and WL3 to WLn, the dummy word lines DWL1 and DWL2, and the selection lines SSL and GSL, a current may not flow to the bit lines DWL1 to BLm, and thus, memory cells connected to the bit lines BL1 to BLm may be recognized as an off state. Accordingly, an error may occur in data read from the flash memory 2100. The memory controller 2200 may determine a memory block, which includes memory cells at which an error occurs, as a bad block. As such, the memory controller 2200 may return a data read failure message to the host 2300.

As described with reference to FIGS. 21 to 24, the flash memory 2100 according to an embodiment of the inventive concept may perform a data protection operation by adjusting a voltage to be applied to the bit line BL or the word line WL. Accordingly, it may be possible to protect data within a short time without an additional hardware change.

IV. Application

A data storage device according to an embodiment of the inventive concept may be applied to various types of products or applications. The data storage device may be implemented with not only electronic devices such as a personal computer, a digital camera, a camcorder, a cellular phone, an MP3, a PMP, a PSP, a PDA, and the like but also storage devices such as a memory card, a USB memory, a solid state drive (hereinafter referred to as an "SSD"), and the like.

Figure 25:
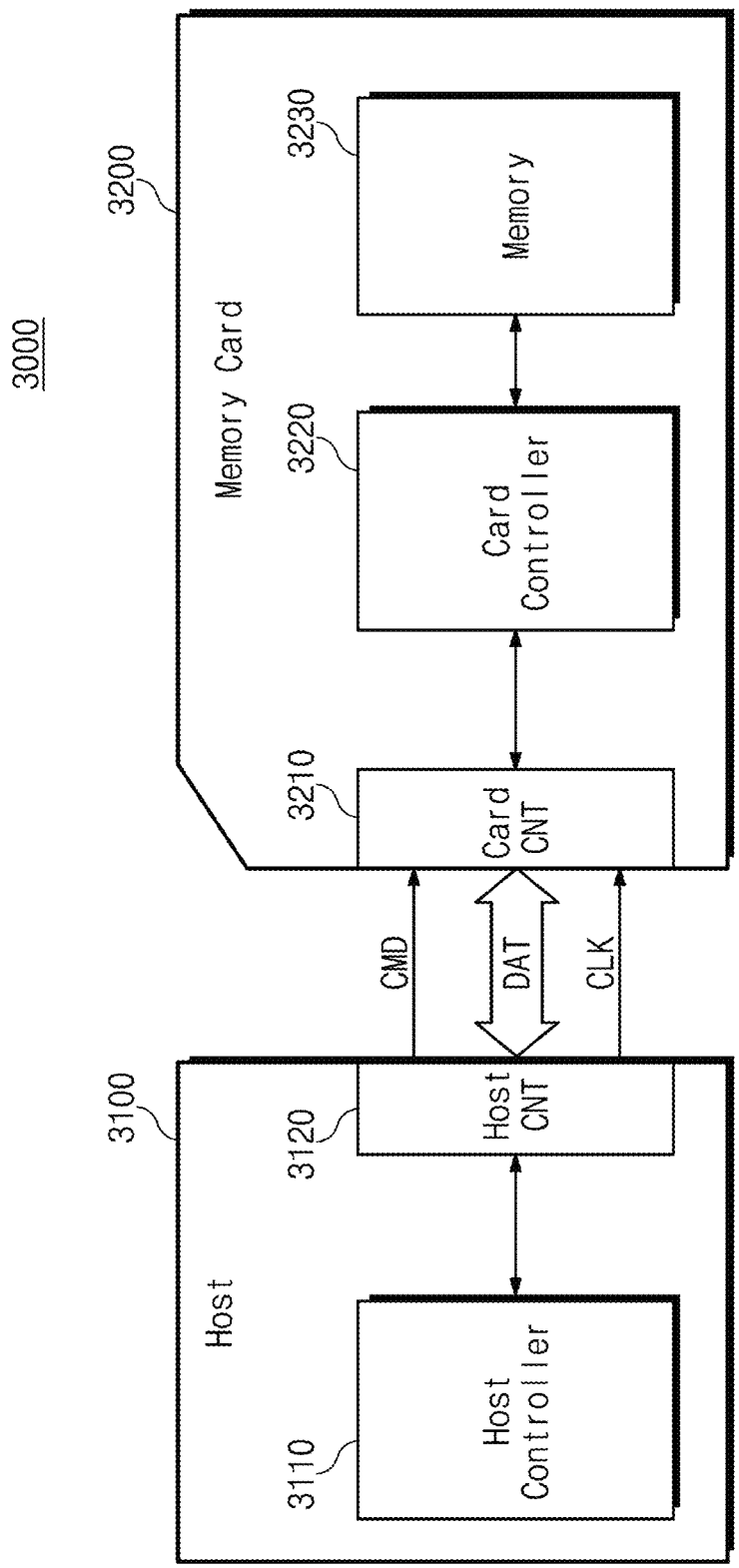
FIG. 25 illustrates an example in which a data storage device according to an embodiment of the inventive concept is applied to a memory card.

FIG. 25 illustrates an example in which a data storage device according to an embodiment of the inventive concept is applied to a memory card. A memory card system 3000 may include a host 3100 and a memory card 3200. The host 3100 may include a host controller 3110 and a host connection unit 3120. The memory card 3200 may include a card connection unit 3210, a card controller 3220 and a flash memory 3230. Here, the flash memory 3230 may be implemented with the three-dimensional flash memory described above.

The host 3100 writes data in the memory card 3200 or reads data stored in the memory card 3200. The host controller 3110 transmits a command (e.g., a write command), a clock signal CLK generated from a clock generator (not illustrated) in the host 3100 and data DAT to the memory card 3200 through the host connection unit 3120.

The card controller 3220 stores data in the flash memory 3230 in response to a write command received through the card connection unit 3210, and in particular, data are stored in synchronization with a clock signal CLK generated from a clock generator (not illustrated) in the card controller 3220. The flash memory 3230 stores data transmitted from the host 3100. For example, in the case that the host 3100 is a digital camera, image data are stored.

Figure 26:
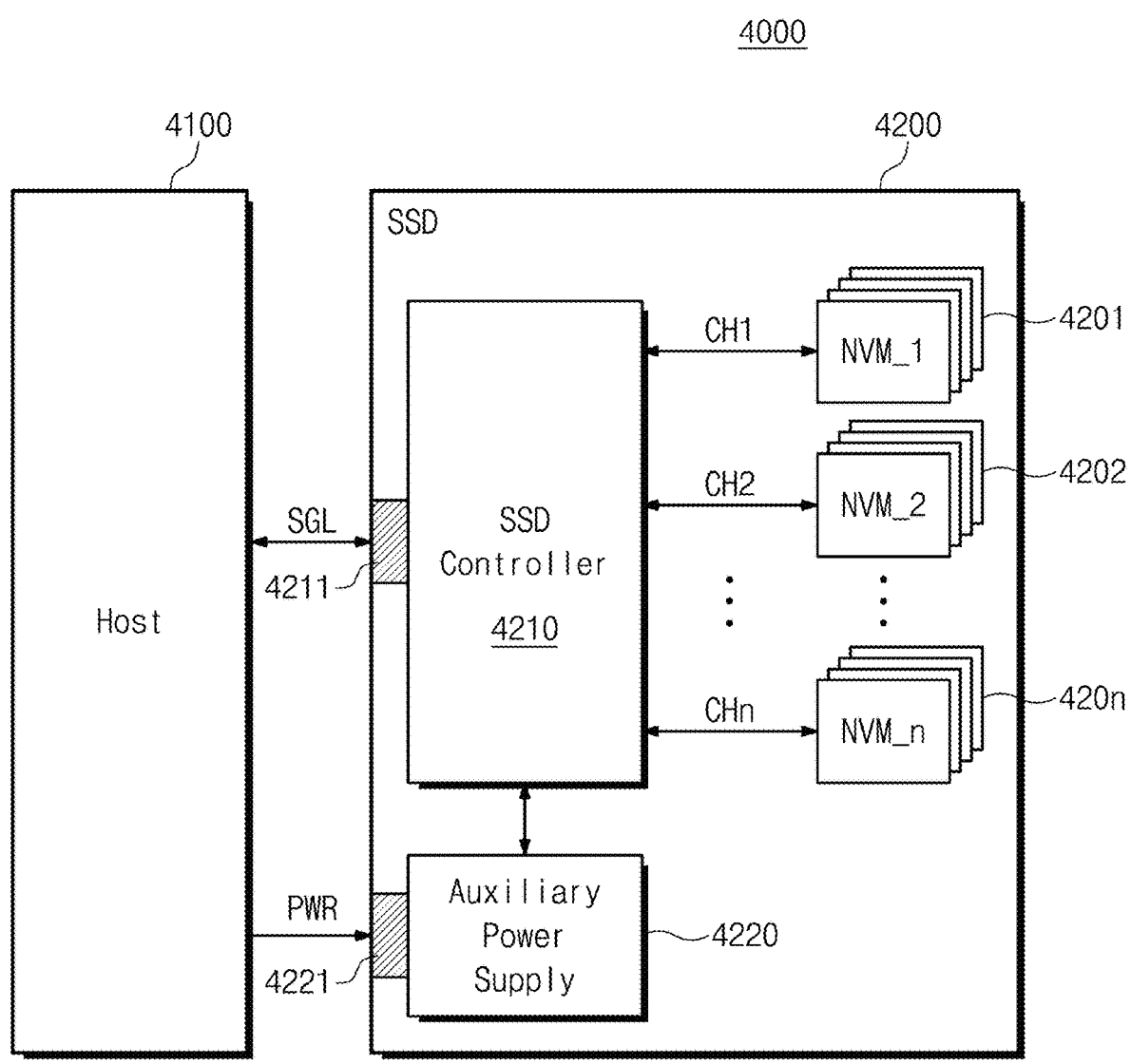
FIG. 26 is a block diagram illustrating an example in which a data storage device according to an embodiment of the inventive concept is applied to a solid state drive (SSD).

FIG. 26 is a block diagram illustrating an example in which a data storage device according to an embodiment of the inventive concept is applied to a solid state drive (SSD). Referring to FIG. 26, an SSD system 4000 includes a host 4100 and an SSD 4200.

The SSD 4200 exchanges a signal with the host 4100 through a signal connector 4211 and receives a power through a power connector 4221. The SSD 4200 may include a plurality of flash memories 4201 to 420n, an SSD controller 4210 and an auxiliary power supply 4220.

The plurality of flash memories 4201 to 420n are used as a storage medium of the SSD 4200. As well as a flash memory, a nonvolatile memory device such as a PRAM, an MRAM, a ReRAM, an FRAM, or the like may be used as a storage medium of the SSD 4200. The plurality of flash memories 4201 to 420n may be connected to the SSD controller 4210 via a plurality of channels CH1 to CHn. One or more flash memories may be connected to one channel. Flash memories connected to one channel may be connected to the same data bus.

The SSD controller 4210 exchanges a signal SGL with the host 4100 through the signal connector 4211. Here, the signal SGL may include a command, an address, data, and the like. Depending on a command of the host 4100, the SSD controller 4210 writes data in a corresponding flash memory or reads data from the corresponding flash memory. An internal configuration of the SSD controller 4210 will be described in detail with reference to FIG. 27.

The auxiliary power supply 4220 is connected with the host 4100 through the power connector 4221. The auxiliary power supply 4220 may receive the power PWR from the host 4100 and may be charged with the received power PWR. The auxiliary power supply 4220 may be located inside the SSD 4200 or may be located outside the SSD 4200. For example, the auxiliary power supply 4220 may be located on a main board and may provide an auxiliary power to the SSD 4200.

Figure 27:
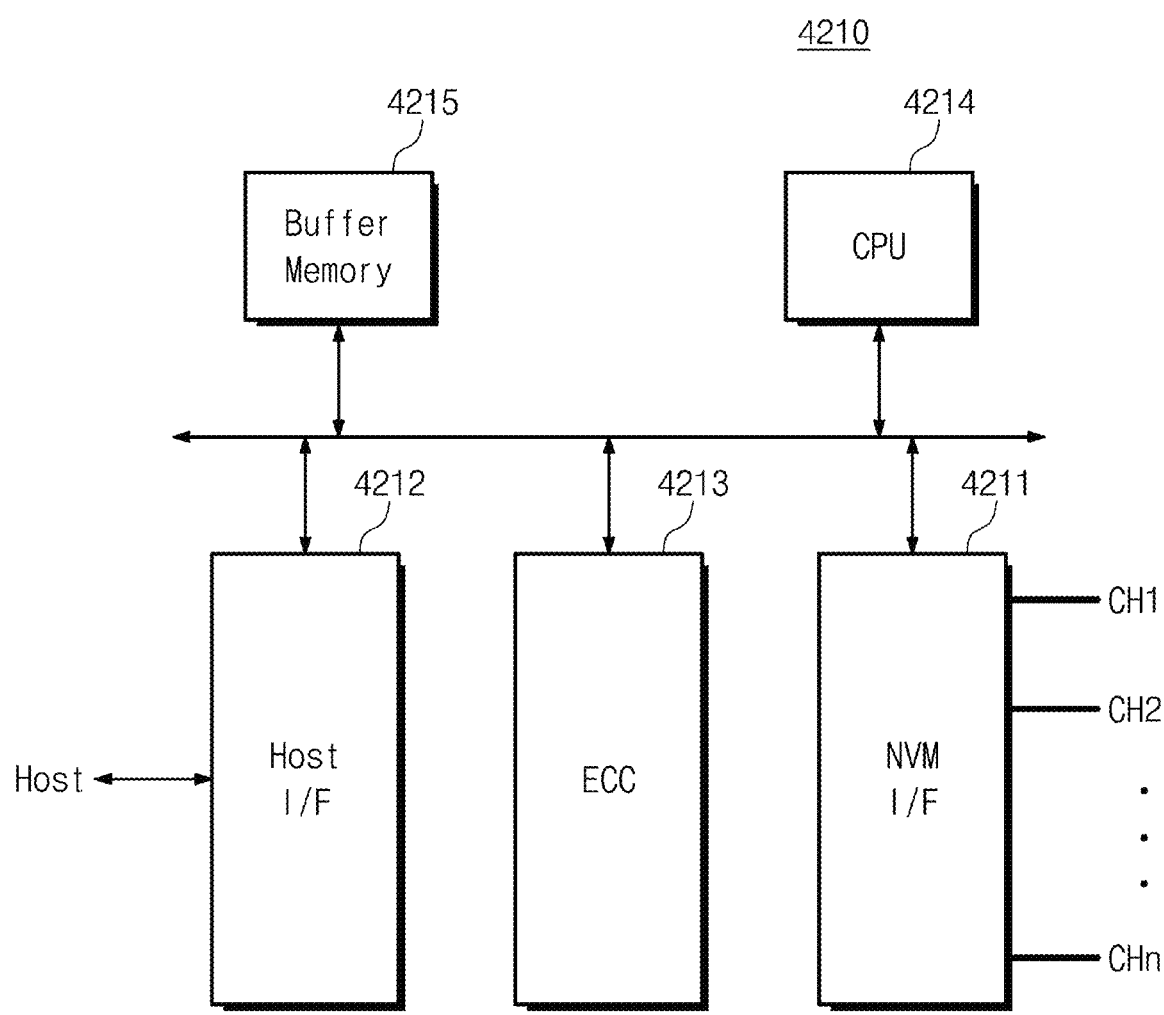
FIG. 27 is a block diagram illustrating a configuration of an SSD controller 4210 illustrated in FIG. 26.

FIG. 27 is a block diagram illustrating a configuration of the SSD controller 4210 illustrated in FIG. 26. Referring to FIG. 27, the SSD controller 4210 includes an NVM interface 4211, a host interface 4212, an ECC circuit 4213, a central processing unit (CPU) 4214, and a buffer memory 4215.

The NVM interface 4211 scatters data transmitted from the buffer memory 4215 to the channels CH1 to CHn. The NVM interface 4211 transmits data read from the flash memories 4201 to 420n to the buffer memory 4215. Here, the NVM interface 4211 may use an interface method of a flash memory. That is, the SSD controller 4210 may perform a program, read, or erase operation in compliance with the flash memory interface manner.

The host interface 4212 provides interfacing with the SSD 4200, which corresponds to a protocol of the host 4100. The host interface 4212 may communicate with the host 4100 by using universal serial bus (USB), small computer small interface (SCSI), PCI express, ATA, parallel ATA (PATA), serial ATA (SATA), serial attached SCSI (SAS), or the like.

Also, the host interface 4212 may perform a disk emulation function that allows the host 4100 to recognize the SSD 4200 as a hard disk drive (HDD).

The ECC circuit 4213 generates an error correction code ECC by using data to be transmitted to the flash memories 4201 to 420n. The error correction code ECC thus generated is stored in a spare area of the flash memories 4201 to 420n. The ECC circuit 4213 detects an error of data that are read from the flash memories 4201 to 420n. When the detected error is correctable, the ECC circuit 4213 corrects the detected error.

The central processing unit 4214 analyzes and processes the signal SGL received from the host 4100 (refer to FIG. 26). The central processing unit 4214 controls the host 4100 or the flash memories 4201 to 420n through the host interface 4212 or the NVM interface 4211. The central processing unit 4214 controls operations of the flash memories 4201 to 420n based on firmware for driving the SSD 4200.

The buffer memory 4215 temporarily stores write data provided from the host 4100 or data read from the flash memories 4201 to 420n. Also, the buffer memory 4215 may store metadata or cache data to be stored in the flash memories 4201 to 420n. In a sudden power-off operation, the metadata or cache data stored in the buffer memory 4215 are stored in the flash memories 4201 to 420n. The buffer memory 4215 may include a DRAM, an SRAM, or the like.

Figure 28:
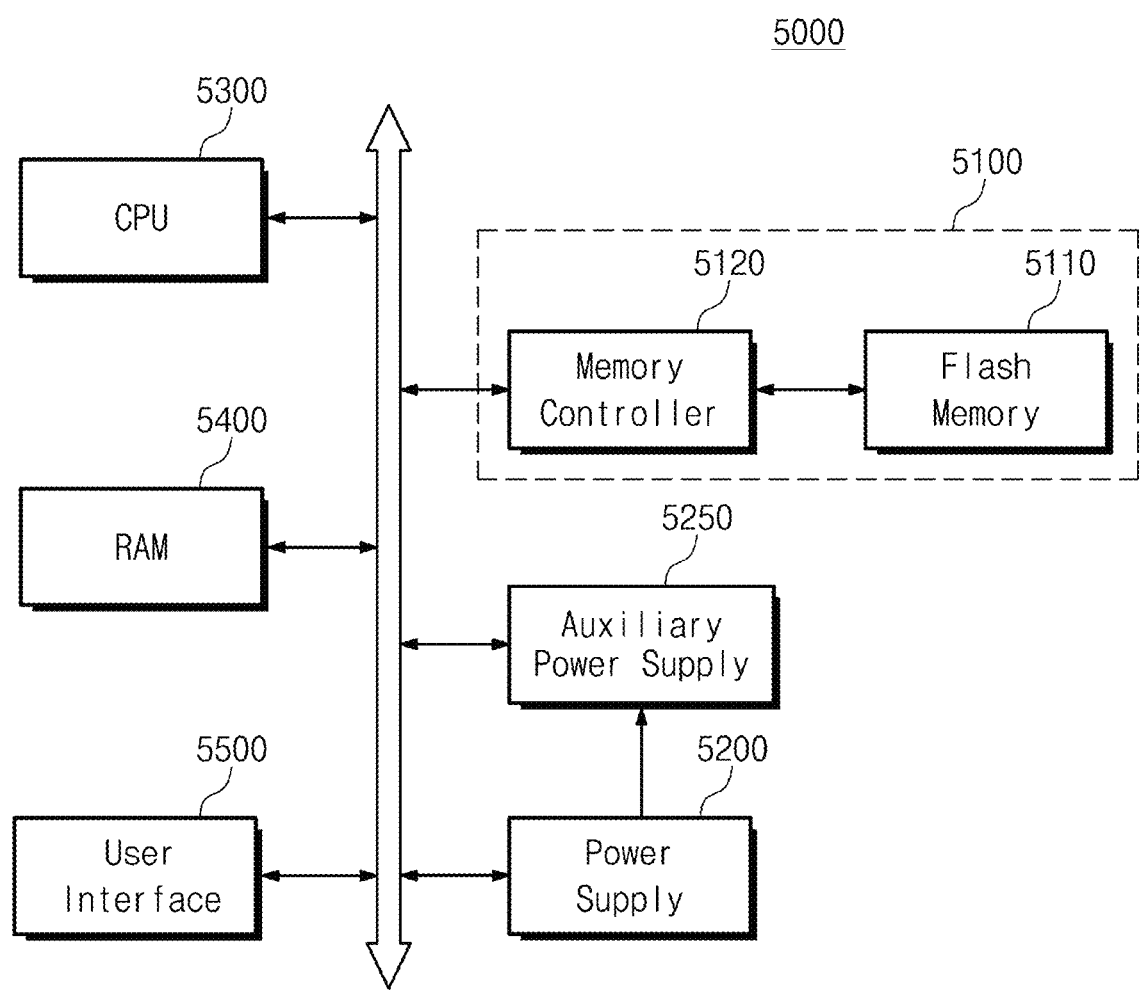
FIG. 28 is a block diagram illustrating an example in which a data storage device according to an embodiment of the inventive concept is implemented in an electronic device.

FIG. 28 is a block diagram illustrating an example in which a data storage device according to an embodiment of the inventive concept is implemented in an electronic device. Here, an electronic device 5000 may be implemented with a personal computer (PC) or may be implemented with a portable electronic device such as a notebook computer, a cellular phone, a personal digital assistant (PDA), a camera, or the like.

Referring to FIG. 28, the electronic device 5000 may include a memory system 5100, a power supply 5200, an auxiliary power supply 5250, a central processing unit 5300, a RAM 5400, and a user interface 5500. The memory system 5100 may include a flash memory 5110 and a memory controller 5120.

The above-mentioned description refers to embodiments for implementing the scope of the inventive concept. Embodiments in which a design is changed simply or which are easily changed may be included in the scope of the inventive concept as well as an embodiment described above. In addition, technologies that are easily changed and implemented by using the above-mentioned embodiments may be also included in the scope of the inventive concept. Therefore, it should be understood that the above embodiments are not limiting, but illustrative.

The invention claimed is:

1. A data storage device comprising:
  a flash memory including a plurality of memory cells connected in series to a bit line; and
  a memory controller,
  wherein, when an address for reading first data stored in a first memory cell of the plurality of memory cells is received from a host, the memory controller is configured to provide a data protection command to the flash memory in a protection mode for protecting data stored in the plurality of memory cells and to provide a read command to the flash memory in a read mode for reading data stored in the plurality of memory cells,
  wherein the flash memory is configured to apply voltages to a plurality of word lines, which are connected to the plurality of memory cells, and the bit line in response to the data protection command such that a first current corresponding to the first data does not flow through the bit line, wherein, in response to the read command, the flash memory applies a selection read voltage to a selected word line corresponding to the received address from among the plurality of word lines, applies a first non-selection read voltage to each of unselected word lines, and applies a first pre-charge voltage to the bit line, wherein, in response to the data protection command, the flash memory applies the selection read voltage to the selected word line, applies the first non-selection read voltage to each of the unselected word lines, and applies a second pre-charge voltage smaller than the first pre-charge voltage to the bit line, and wherein, as the second pre-charge voltage is applied, the first current does not flow through the bit line.

2. The data storage device of claim 1, wherein the memory controller is configured to return a data read failure message to the host.

3. The data storage device of claim 1, wherein, in response to the data protection command, the flash memory applies the selection read voltage to the selected word line, applies a second non-selection read voltage smaller than the first non-selection read voltage to each of the unselected word lines, and applies the first pre-charge voltage to the bit line, and wherein, as the second non-selection read voltage is applied, the first current does not flow through the bit line.

4. The data storage device of claim 3, wherein the memory controller is configured to return a data read failure message to the host.

5. The data storage device of claim 1, wherein the memory controller provides the data protection command to the flash memory when the received address is matched with a preset address and provides the read command to the flash memory when the received address is not matched with the preset address.

* * * * *